(12) United States Patent
Terada et al.

(10) Patent No.: US 8,400,815 B2
(45) Date of Patent: Mar. 19, 2013

(54) NONVOLATILE SEMICONDUCTOR MEMORY DEVICE

(75) Inventors: Yuri Terada, Yokohama (JP); Hiroshi Maejima, Chuo-ku (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 324 days.

(21) Appl. No.: 12/825,924

(22) Filed: Jun. 29, 2010

(65) Prior Publication Data

US 2011/0044090 A1 Feb. 24, 2011

(30) Foreign Application Priority Data

Aug. 19, 2009 (JP) ................................. 2009-190472

(51) Int. Cl.
*G11C 11/00* (2006.01)
(52) U.S. Cl. ...................................................... 365/148
(58) Field of Classification Search .................... 365/148
See application file for complete search history.

(56) References Cited

U.S. PATENT DOCUMENTS

| 7,403,426 B2 * | 7/2008 | Hamzaoglu et al. ..... 365/185.23 |
| 7,668,001 B2 * | 2/2010 | Tajiri et al. .................... 365/148 |
| 2008/0175073 A1 * | 7/2008 | Seo ........................... 365/189.11 |
| 2009/0080265 A1 * | 3/2009 | Mokhlesi et al. ......... 365/185.23 |
| 2010/0321977 A1 * | 12/2010 | Sekar et al. .................... 365/148 |

FOREIGN PATENT DOCUMENTS

| JP | 2002-541613 | 12/2002 |
| WO | WO 00/62301 | 10/2000 |

* cited by examiner

*Primary Examiner* — Hoai V Ho
*Assistant Examiner* — Min Huang
(74) *Attorney, Agent, or Firm* — Oblon, Spivak, McClelland, Maier & Neustadt, L.L.P.

(57) ABSTRACT

A nonvolatile semiconductor memory device according to an embodiment includes: a memory cell array including a plurality of first lines and second lines intersecting each other and a plurality of memory cells connected at intersections of the plurality of first lines and second lines; and a first line control circuit and a second line control circuit configured to select the first lines and the second lines respectively to supply a voltage or current necessary for a resetting operation or a setting operation on the memory cells. The first line control circuit supplies unselected ones of the first lines with an unselecting voltage corresponding to the distance between the unselected first lines and the second line control circuit.

24 Claims, 22 Drawing Sheets

NONVOLATILE SEMICONDUCTOR MEMORY DEVICE

CROSS REFERENCE TO RELATED APPLICATIONS

This application is based on and claims the benefit of priority from prior Japanese Patent Application No. 2009-190472, filed on Aug. 19, 2009, the entire contents of which are incorporated herein by reference.

BACKGROUND

1. Field

Embodiments described herein relate generally to a nonvolatile semiconductor memory device.

2. Description of the Related Art

Recently, attention has been paid to nonvolatile memories configured as an array of memory cells each including a variable resistance element and connected at an intersection of a word line and a bit line.

Known as nonvolatile memories of this type are a PCRAM (Phase-Change Random Access Memory) using a chalcogenide element as a variable resistance element, a ReRAM (Resistance Random Access Memory) using a transition metal oxide element, a CBRAM for varying a resistance by forming a bridge (a conducting bridge) between electrodes by precipitating metal cations and destroying the bridge by ionizing the precipitated metal, etc. A characteristic of these variable resistance memories is that the memories store changes of the resistance as information.

A PCRAM controls the resistance of a chalcogenide element by changing the phase of the element between a crystallized state and a non-crystallized state by controlling its process from heat generation to cooling by means of the shape, i.e., size, width, etc. of a current/voltage pulse to be applied to the element. ReRAMs include a bipolar type and a unipolar type. The bipolar type controls the resistance of a transition metal oxide element by means of the direction of a current/voltage pulse to be applied to the element. On the other hand, the unipolar type controls the resistance of a transition metal oxide element by means of the size, width, etc. of a current/voltage pulse to be applied to the element.

The unipolar type is preferable for realizing a high-density memory cell array. This is because the memory cell array of the unipolar type is formed without a transistor but with a variable resistance element and a rectifying element such as a diode, etc., which are stacked at each cross-point of a bit line and a word line.

In the case of a unipolar type ReRAM, data is written into the variable resistance memory when a program voltage of, for example, approximately 6.0V is applied to a variable resistance element for approximately 10 ns. This causes the variable resistance element to change from a high resistance state to a low resistance state. This change of states is referred to as being "programmed" or "set". When an erasing voltage of approximately 2.0V is applied to a data-programmed variable resistance element to make a current of 1 µA to 10 µA flow for 200 ns to 1 µs, the variable resistance element changes from a low resistance state to a high resistance state. This change of states is referred to as being "erased" or "reset". Stabilization of resetting is an important issue for improving reliability of a nonvolatile memory using such a variable resistance element.

DETAILED DESCRIPTION

A nonvolatile semiconductor memory device according to an embodiment includes: a memory cell array including a plurality of first lines and second lines intersecting each other and a plurality of memory cells connected at the intersections of the plurality of first lines and second lines; and a first line control circuit and a second line control circuit configured to select the first lines and the second lines respectively to supply a voltage or current necessary for a resetting operation or a setting operation on the memory cells. The first line control circuit is characterized by supplying unselected ones of the first lines with an unselecting voltage corresponding to the distance between these unselected first lines and the second line control circuit.

A nonvolatile semiconductor memory device according to an embodiment will now be explained with reference to the drawings.

[First Embodiment]
[Overall Configuration]

Figure 1:
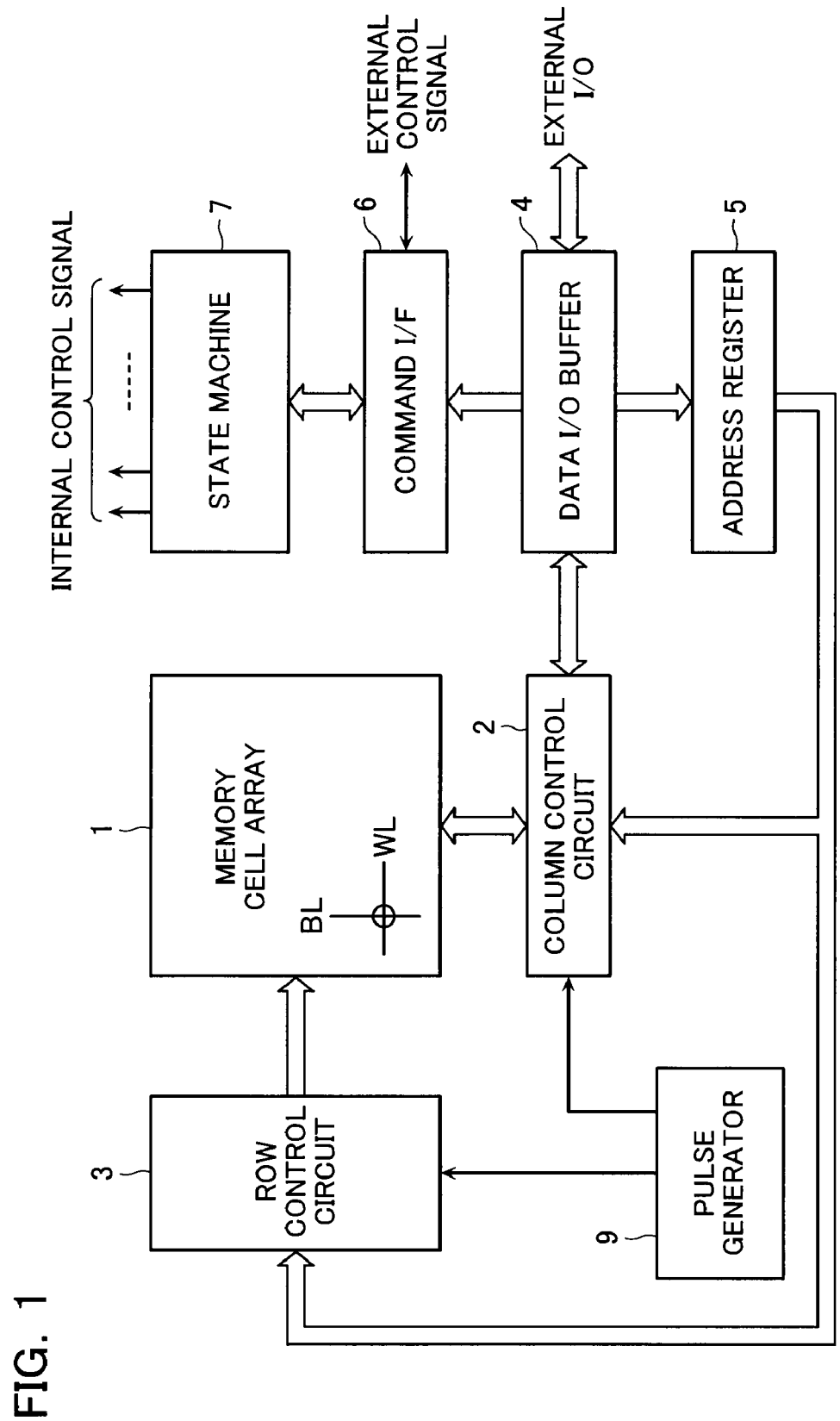
FIG. 1 is a block diagram of a nonvolatile memory according to a first embodiment.

FIG. 1 is a block diagram of a nonvolatile memory according to a first embodiment.

The nonvolatile memory includes a memory cell array 1 configured as a matrix array of memory cells each using a resistance varying element described later such as a PCRAM (phase change element), a ReRAM (variable resistance element), etc. Provided at a position adjoining the memory cell array 1 in the direction along bit lines BL (second lines) is a column control circuit 2 or a second line control circuit configured to control the bit lines BL of the memory cell array 1 to erase data from memory cells, write data into memory cells, and read data from memory cells. Provided at a position adjoining the memory cell array 1 in the direction along word lines WL (first lines) is a row control circuit 3 or a first line control circuit configured to select a word line WL of the memory cell array 1 to apply a voltage necessary for erasing data from memory cells, writing data into memory cells, and reading data from memory cells. The column control circuit 2 and the row control circuit 3 constitute a data reading/writing circuit which reads data from or writes data into the memory cell array 1.

A data I/O buffer 4 is connected to an unillustrated external host device, and receives write data or an erase instruction from the host device, outputs read data to the host device, and receives address data and command data from the host device. The data I/O buffer 4 sends received write data to the column control circuit 2, or receives read data from the column control circuit 2 and externally outputs the data. An address supplied by the external host device to the data I/O buffer 4 is sent to the column control circuit 2 and the row control circuit 3 through an address register 5. A command supplied by the external host device to the data I/O buffer 4 is sent to a command interface 6. The command interface 6 receives an external control signal from external, determines whether data input in the data I/O buffer 4 is write data, a command, or an address, and when it is a command, transfers it to a state machine 7 as a received command signal. The state machine 7 manages the nonvolatile memory on the whole, receives a command from the external host device, and manages reading, writing, erasing, and input or output of data. The external host device can receive status information managed by the state machine 7 to determine the result of an operation. The status information is also used for controlling writing and erasing.

A pulse generator 9 is controlled by the state machine 7. Under this control, the pulse generator 9 can output a pulse of an arbitrary voltage at an arbitrary timing. The generated pulse can be transferred to an arbitrary line selected by the column control circuit 2 and the row control circuit 3.

The peripheral circuit elements other than the memory cell array 1 can be formed in a silicon (Si) substrate immediately beneath the memory cell array 1 formed in an interconnection layer. This enables the nonvolatile memory to have a chip area substantially equal to the area of the memory cell array 1.

[Memory Cell Array and Its Peripheral Circuits]

Figure 2:
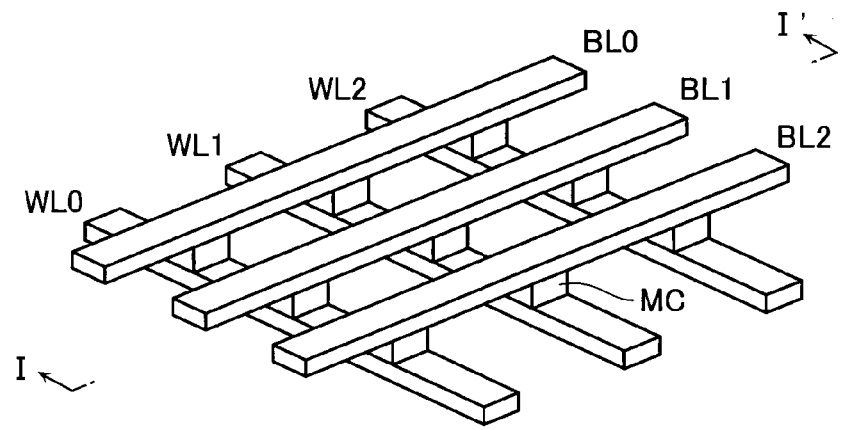
FIG. 2 is a perspective diagram of a part of a memory cell array of the nonvolatile memory according to the first embodiment.
Figure 3:
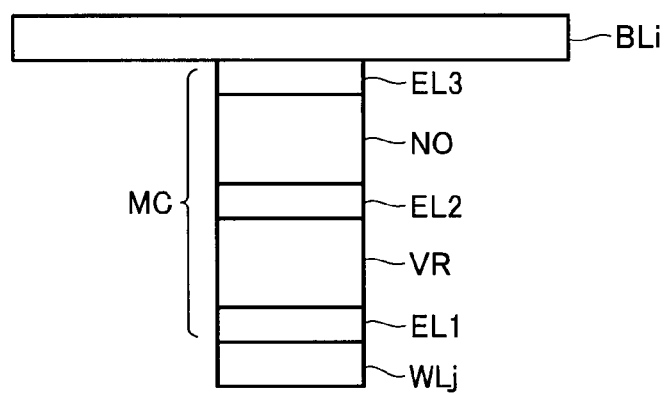
FIG. 3 is a cross sectional diagram of one memory cell taken along a line I-I' of FIG. 2 and seen in the direction of the arrows.

FIG. 2 is a perspective diagram of a part of the memory cell array 1. FIG. 3 is a cross sectional diagram of one memory cell taken along a line I-I' of FIG. 2 and seen in the direction of the arrows.

Word lines WL0 to WL2 as a plurality of first lines are provided in parallel, bit lines BL0 to BL2 as a plurality of second lines are provided in parallel to cross the word lines, and memory cells MC are disposed at the intersections of these lines as sandwiched between these lines. The first and second lines are preferably made of a material that is heat-resistant and has a low resistance, and may be made of, for example, W, WSi, NiSi, CoSi, etc.

As shown in FIG. 3, a memory cell MC is composed of a variable resistance element VR and a non-ohmic element NO which are connected in series.

The variable resistance element VR can vary its resistance via a current, heat, chemical energy, etc. upon voltage application, and includes electrodes EL1 and EL2 which are provided on the top and bottom to function as both a barrier metal and an adhesive layer. The electrode material may be Pt, Au, Ag, TiAlN, SrRuO, Ru, RuN, Ir, Co, Ti, TiN, TaN, LaNiO, Al, PtIrO$_x$, PtRhO$_x$, Rh/TaAlN, etc. The element may also include a metal film which provides a uniform orientation. The element may also specially include a buffer layer, a barrier metal layer, an adhesive layer, etc.

The variable resistance element VR may be a type (PCRAM) that varies its resistance through phase change between a crystallized state and a non-crystallized state as in chalcogenide, etc., a type (CBRAM) that varies its resistance by forming a bridge (a conducting bridge) between electrodes by precipitating metal cations and destroying the bridge by ionizing the precipitated metal, a type (ReRAM) that varies its resistance upon voltage or current application (this type is roughly classified into those that cause a resistance change depending on presence or absence of charges trapped in a charge trap existing at an electrode interface and those that cause a resistance change depending on presence or absence of a conducting path due to oxygen loss, etc.), etc.

Figure 4:
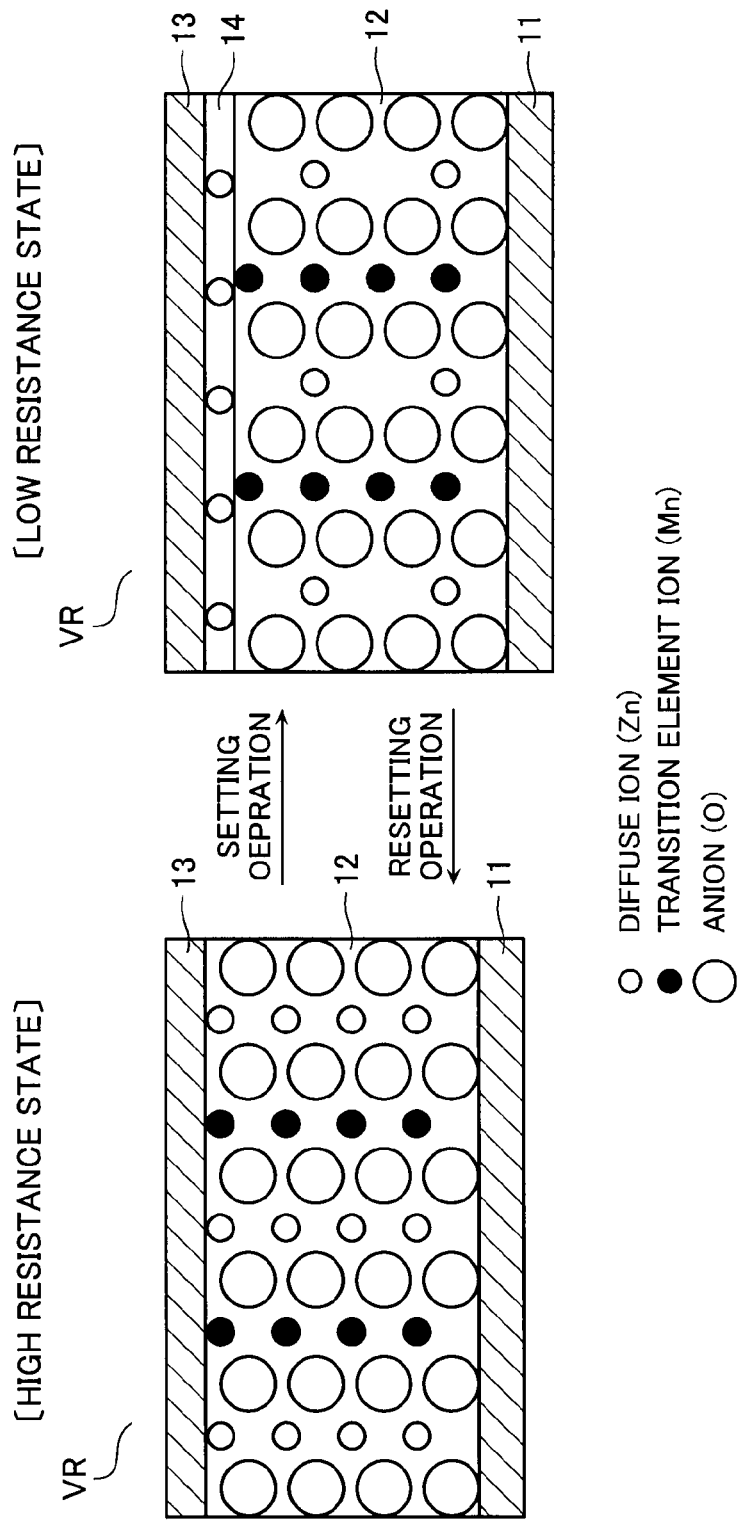
FIG. 4 is an exemplary cross sectional diagram showing an example of a variable resistance element according to the first embodiment.

FIG. 4 is a diagram showing an example of ReRAM. The variable resistance element VR shown in FIG. 4 is composed of electrode layers 11 and 13, and a recording layer 12 positioned between them. The recording layer 12 is made of a complex compound containing at least two kinds of cationic elements. At least one kind of the cationic elements should be a transition element having a d-orbital incompletely filled with electrons, and the shortest distance between adjoining cationic elements should be 0.32 nm or shorter. Specifically, the recording layer 12 is made of a material which is represented by a chemical formula $A_xM_yX_z$ (where A and M are different elements), and which has a crystalline structure such as a spinel structure ($AM_2O_4$), an ilmenite structure ($AMO_3$), a delafossite structure ($AMO_2$), a LiMoN$_2$ structure ($AMN_2$), a wolframite structure ($AMO_4$), an olivine structure ($A_2MO_4$), a hollandite structure ($A_xMO_2$), a ramsdellite structure ($A_xMO_2$), a perovskite structure ($AMO_3$), etc.

In the example of FIG. 4, A is Zn, M is Mn, and X is O. Small white circles in the recording layer 12 represent diffuse ions (Zn), large white circles represent anions (O), and small black circles represent transition element ions (Mn). The recording layer 12 is in a high resistance state initially, but when a negative voltage is applied to the electrode layer 13 while the electrode layer 11 is set at a fixed potential, some diffuse ions in the recording layer 12 move toward the electrode layer 13, and hence diffuse ions in the recording layer 12 are reduced relative to anions. The diffuse ions having moved toward the electrode layer 13 receive electrons from the electrode layer 13 and precipitate as a metal, forming a metal layer 14. In the recording layer 12, anions have become excessive, which leads to elevating the lower layer of the transition element ions in the recording layer 12. Hence, the recording layer 12 becomes electron-conductive through carrier injection and enters a set state. To reproduce the data requires causing such a minute current as would not induce a resistance change of the material of the recording layer 12 to flow through the recording layer 12. To turn the programmed state (low resistance state) into the initial state (high resistance state) to erase the data requires, for example, causing a large current to flow through the recording layer 12 for a sufficient time to cause Joule heating and promote the oxidoreduction reaction of the recording layer 12. Applying an electric field in a direction opposite to the setting operation can also achieve resetting.

Figure 5:
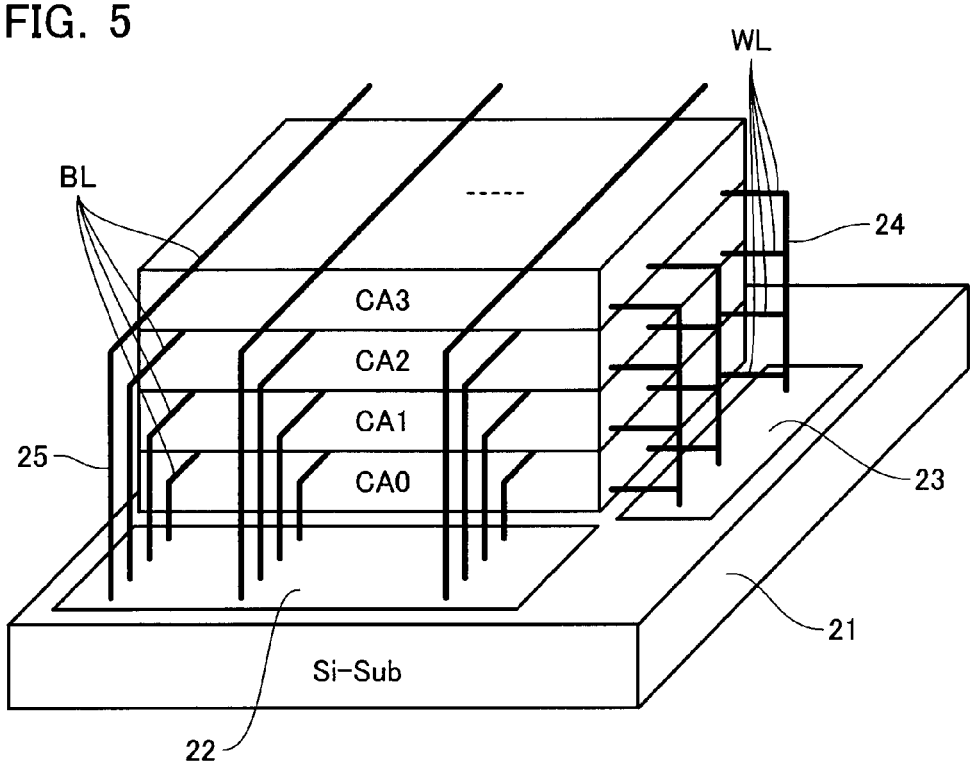
FIG. 5 is a perspective diagram showing the memory cell array of the nonvolatile memory according to the first embodiments and peripheral circuits thereof.

Plural layers of such memory cell arrays 1 as described above may be stacked and formed into a three-dimensional structure as shown in FIG. 5. The shown example is a stack of four memory cell arrays CA0 to CA3 formed on a silicon substrate 21. The word lines WL of the respective memory cell arrays are commonly connected to via lines 24 to be connected to a row control circuit 23 on the substrate 21. The bit lines BL of the respective memory cell arrays CA0 to CA3 are individually connected to a column control circuit 22 on the substrate 21 through different via lines 25.

Figure 6:
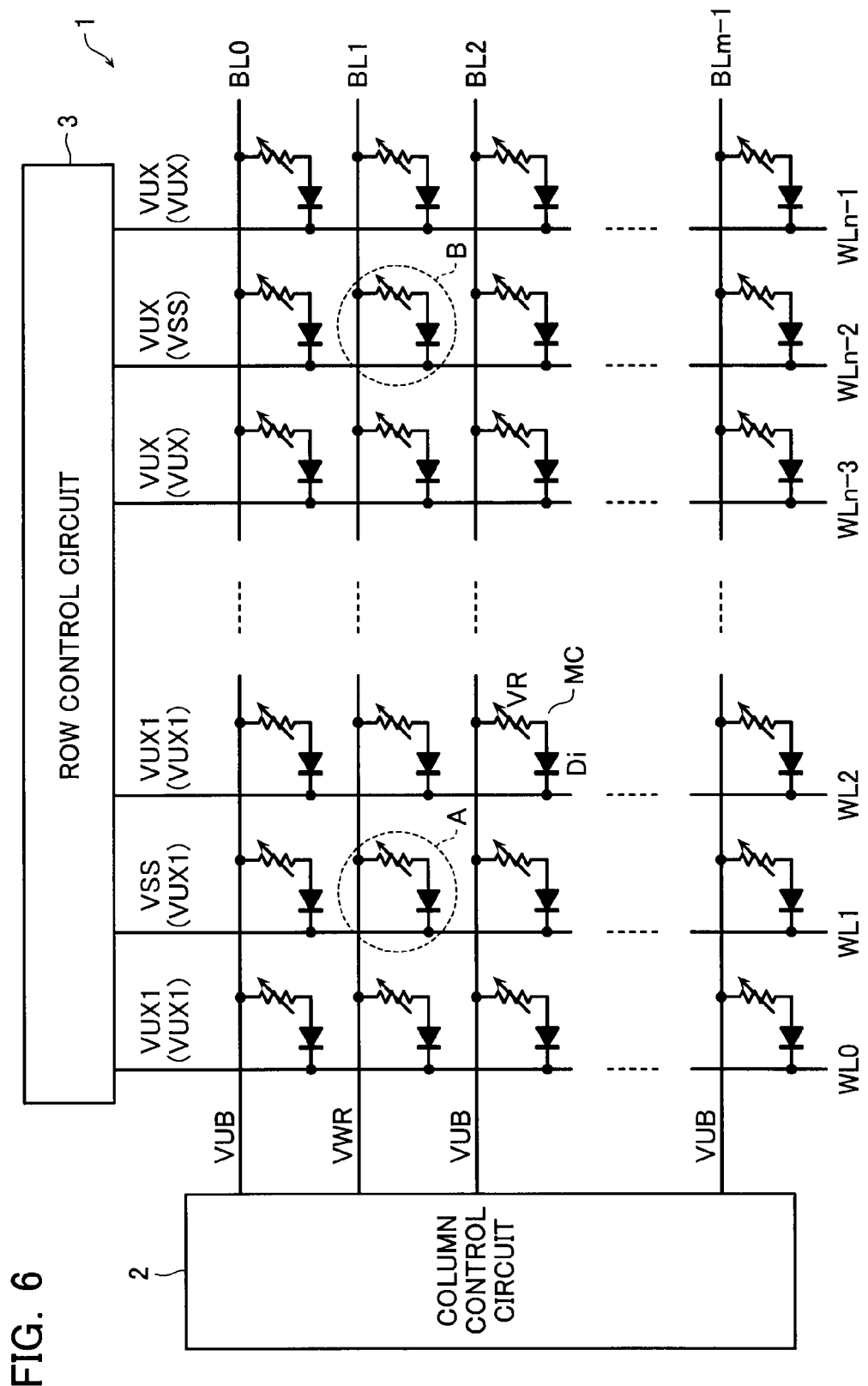
FIG. 6 is a circuit diagram of the memory cell array of the nonvolatile memory according to the first embodiment and peripheral circuits thereof.

FIG. 6 is an equivalent circuit diagram showing the details of the memory cell array 1 of FIG. 1. The following explanation will assume that a diode Di is used as the non-ohmic element NO and that the structure is a single-layered one for ease of explanation.

In FIG. 6, a memory cell MC of the memory cell array 1 is composed of a diode Di and a variable resistance element VR which are connected in series. The anode of the diode Di is connected to a bit line BL via the variable resistance element VR, and the cathode thereof is connected to a word line WL. One end of each bit line BL is connected to the column control circuit 2. One end of each word line WL is connected to the row control circuit 3.

The memory cells MC may be individually selected, or a plurality of memory cells MC connected to a selected word line WL may be simultaneously read out. The polarity of the diode Di of the memory cell array 1 may be reversed from the circuit shown in FIG. 6, so that a current may flow from the word line WL to the bit line BL.

[Operation of Nonvolatile Memory]

Next, an operation of the nonvolatile memory having the above configuration will be explained.

Here, it is assumed that a memory cell MC connected to a word line WL1 and a bit line BL1 shown in the dotted-line circle A in FIG. 6 is a selected memory cell to which data erasing and writing is to be executed.

For previous knowledge before the nonvolatile memory according to the first embodiment is explained, nonvolatile memories according to comparative examples will be explained.

Figure 25A:
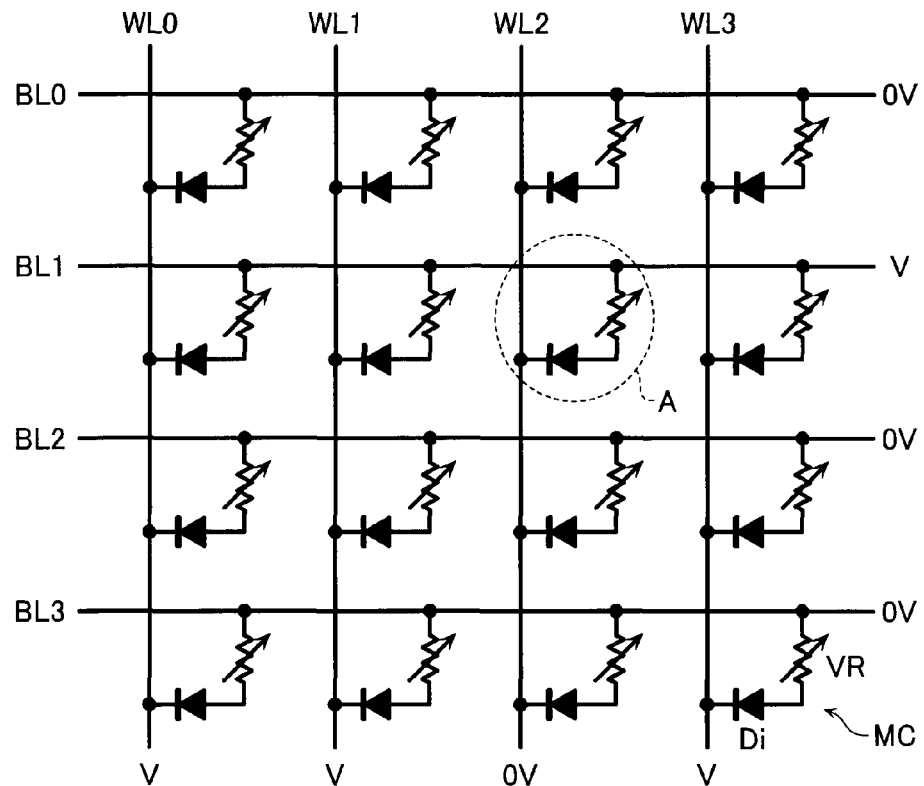
FIG. 25A is a circuit diagram of a memory cell array of a nonvolatile memory according to a first comparative example and FIG. 25B is a diagram showing a biased state of each memory cell.
Figure 25B:
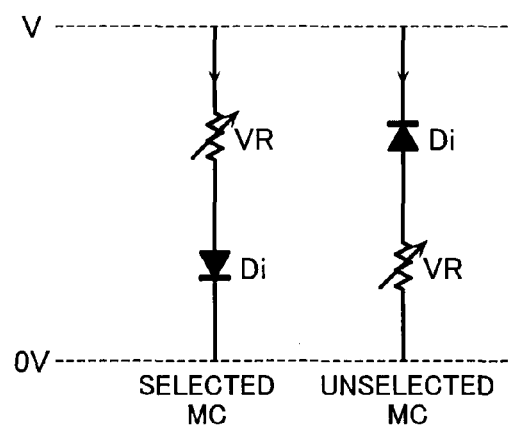

FIG. 25A is a diagram showing a state of bias voltages supplied for erasing data from or writing data into a memory cell array of a nonvolatile memory according to a first comparative example. FIG. 25B is a diagram showing a biased state of each memory cell shown in FIG. 25A.

Figure 7:
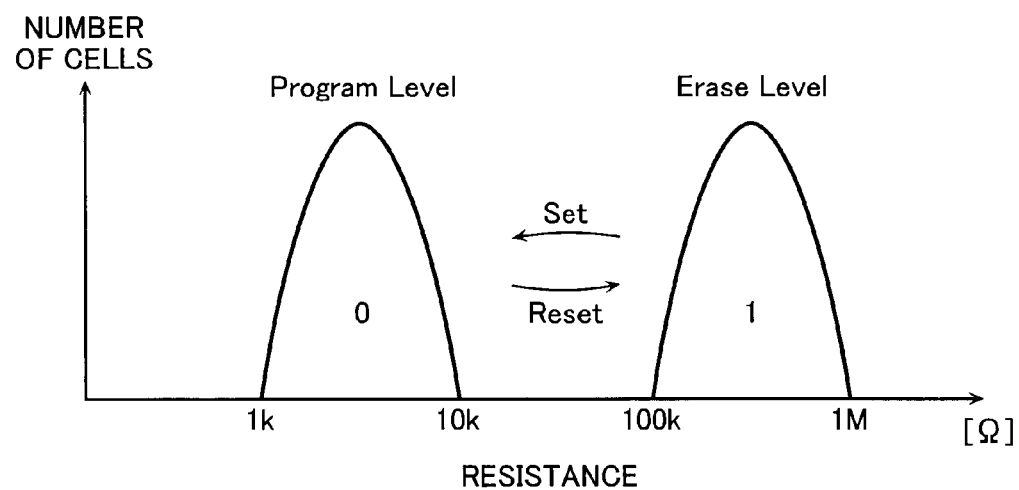
FIG. 7 is a graph showing a relationship between a distribution of resistance values of variable resistance elements and data, when memory cells of the nonvolatile memory according to the first embodiments store binary data.

When the dotted-line circuit A in FIG. 25A is a selected memory cell, data erasing is executed by a resetting operation of causing a current of 1 µA to 10 µA to flow for 200 ns to 1 µs by applying 0V to the word line WL2 and a voltage V necessary for data erasing of, e.g., approximately 2.0V to the bit line BL1. Data writing into the variable resistance element VR is executed by applying for 10 ns to 100 ns, 0V to the word line WL2 and a voltage V necessary for data writing of, e.g., approximately 6.0V (having a current value of approximately 10 nA) to the bit line BL1 to thereby move the resistance of the variable resistance element VR to a low resistance range. Data erasing corresponds to a resetting operation of writing data "1", and data writing corresponds to a setting operation of writing data "0". As shown in FIG. 7, the resistance of the variable resistance element VR constituting the memory cell MC is distributed in a high resistance range of 100 kΩ to 1 MΩ when the element is in an erased state and in a low resistance range of 1 kΩ to 10 kΩ when the element is in a written (programmed) state.

In the first comparative example, a current of approximately 10 µA necessary for a resetting operation flows through the diode Di of the selected memory cell MC as shown in FIG. 25B. Therefore, when there are several selected memory cells MC in one block, the total current to be consumed by the selected memory cells MC for data erasing is approximately several times ten µA.

Meanwhile, an off-leakage current of approximately 1 nA flows in an opposite direction through the diode Di of an unselected memory cell MC connected to an unselected bit line BL and an unselected word line WL. When in a block of a 1K×1K size, the total current to be consumed by unselected memory cells MC included in the block is approximately 1 mA.

There is no potential difference across both ends of such memory cells MC that are connected to a selected word line WL or a selected bit line BL but are not a selected memory cell MC (hereinafter referred to as "half-selected memory cell"). Therefore, no current is consumed by the diode Di of such half-selected memory cells.

Hence, the total current to be consumed when data is erased from a memory cell array of a 1K×1K (=1M) size is approximately 1 mA.

Figure 26A:
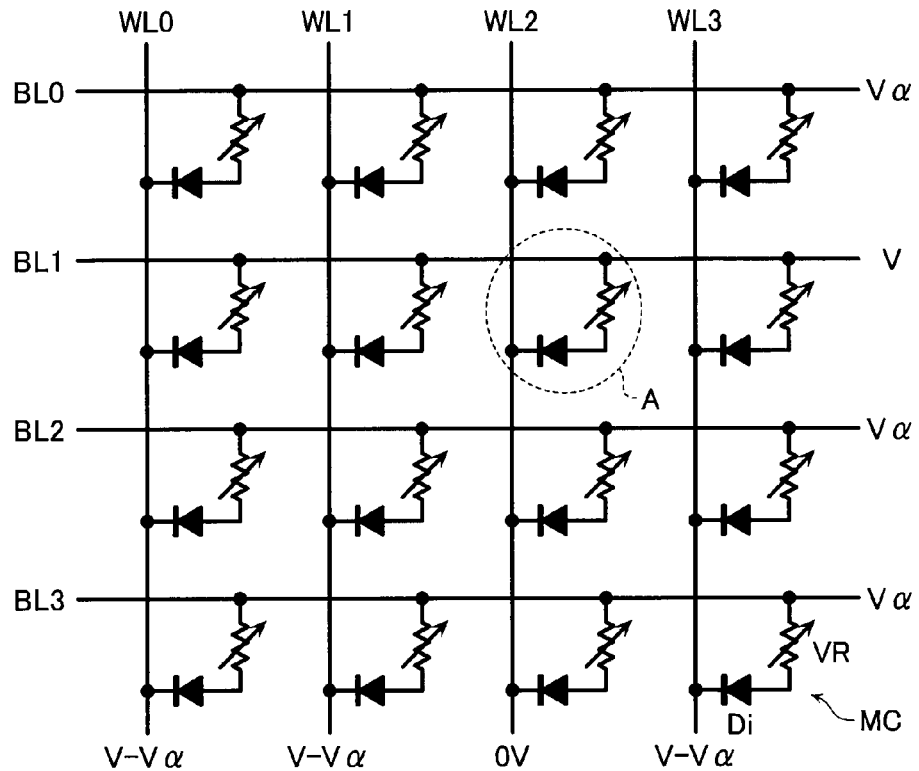
FIG. 26A is a circuit diagram of a memory cell array of a nonvolatile memory according to a second comparative example and FIG. 26B is a diagram showing a biased state of each memory cell.
Figure 26B:
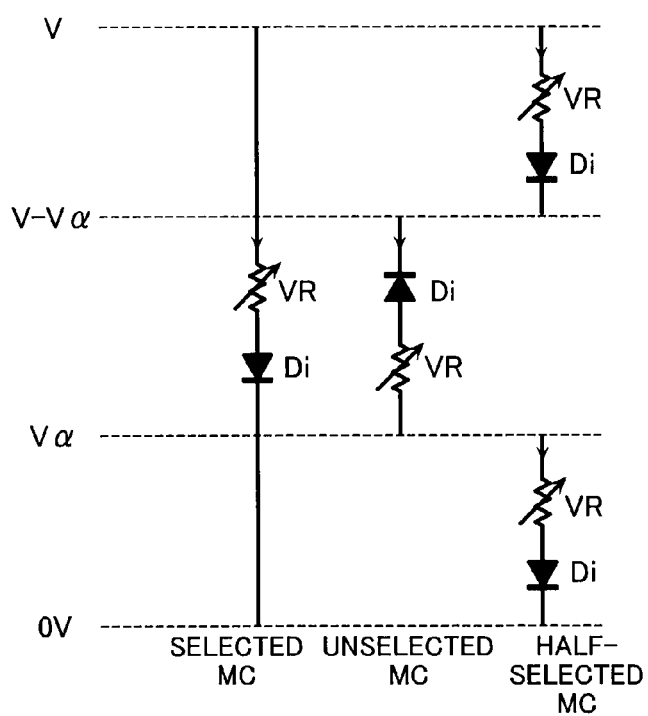

FIG. 26A is a diagram showing a state of bias voltages supplied for erasing data from or writing data into a memory cell array of a nonvolatile memory according to a second comparative example. FIG. 26B is a diagram showing a biased state of each memory cell shown in FIG. 26A.

In the nonvolatile memory according to the second comparative example, a certain bias voltage Vα is applied to an unselected bit line BL, and a voltage (V−Vα) smaller than a voltage V by the bias voltage Vα is applied to an unselected word line WL. In this case, the potential difference across both ends of an unselected memory cell MC is smaller than in the first comparative example by 2×Vα. Therefore, an off-leakage current flowing through an unselected memory cell is approximately 0.1 nA. Hence, the total current to be consumed by all unselected memory cells MC in a block can be suppressed to approximately 100 µA.

A potential difference equal to the bias voltage Vα occurs across both ends of a half-selected memory cell MC, which thus consumes a current of approximately 10 nA. Hence, the total current to be consumed by all half-selected memory cells MC in a block is approximately 20 µA.

Hence, according to the second comparative example the total current to be consumed when data is erased from a block can be suppressed to approximately 120 µA.

Figure 27:
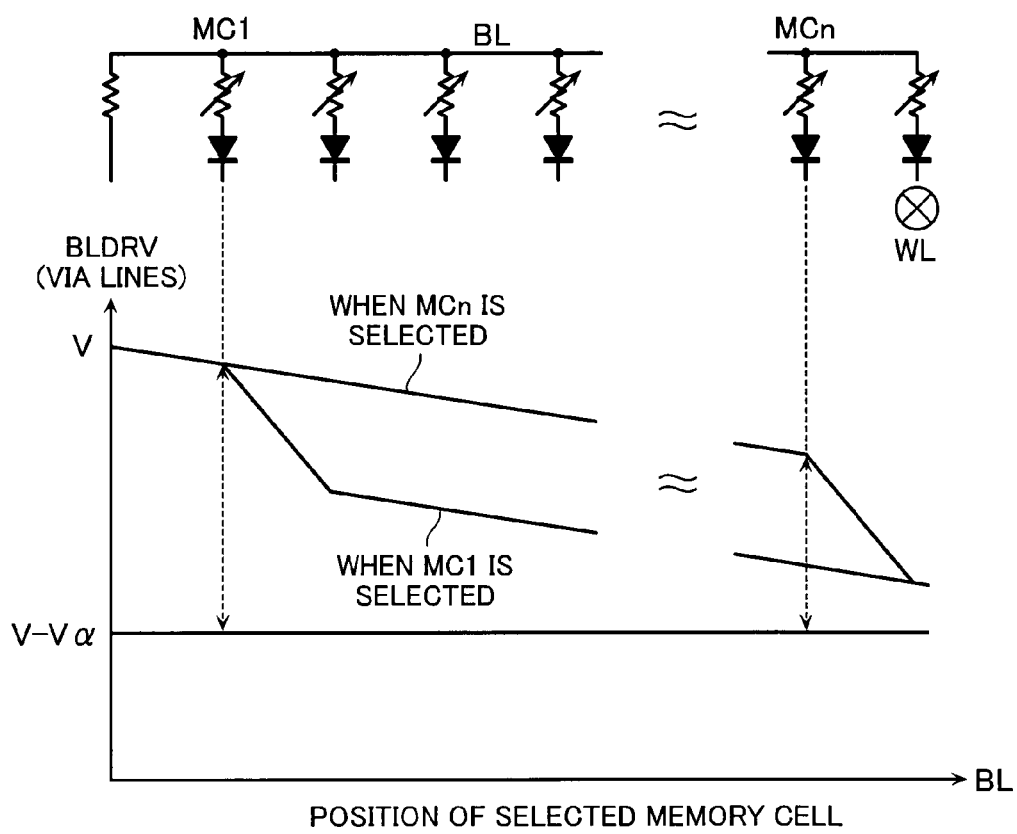
FIG. 27 is a graph showing a relationship between the position of memory cells and biased states in the nonvolatile memory according to the second comparative example.

The first and second comparative examples both assume that the selected memory cell MC is located close to a bit line driver and a word line driver. Hence, when a memory cell MC close to the bit line driver BLDRV (via lines) such as a memory cell MC1 shown in FIG. 27 is selected, a sufficient biased state necessary for a resetting operation can be obtained across both ends of the selected memory cell MC. However, when a memory cell MC far from the bit line driver BLDRV such as a memory cell MCn shown in FIG. 27 is selected, voltage reduction through the half-selected memory cells MC existing between the bit line driver BLDRV and the selected memory cell MC is unignorable. In this regard, the second comparative example can improve the amount (gradient) of voltage reduction by means of the bias voltage Vα. However, an expected biased state might still be impossible to obtain depending on the position of the selected memory cell MC.

Figure 8:
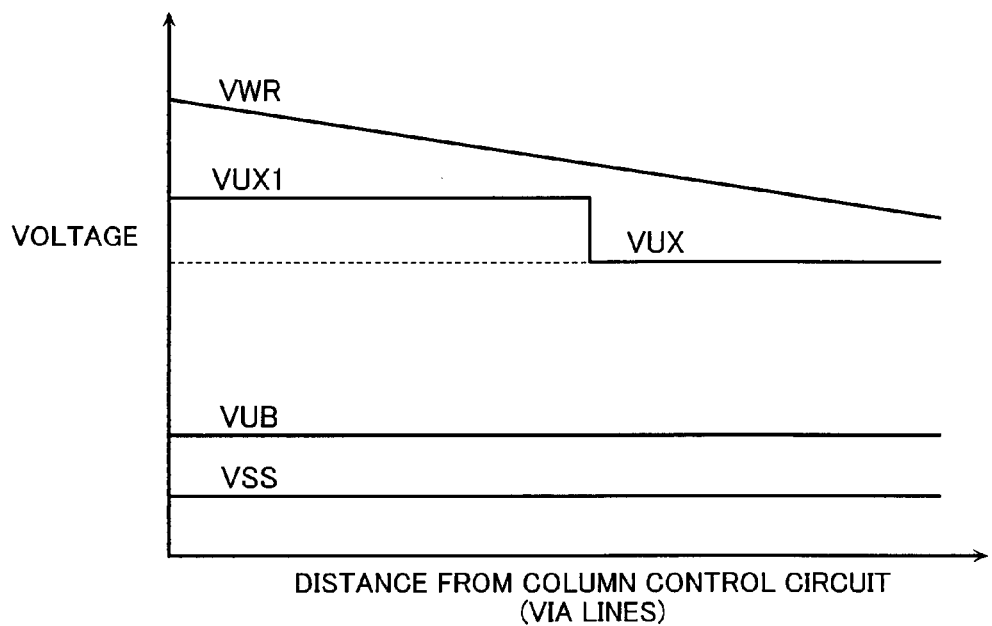
FIG. 8 is a graph showing a relationship between bias voltages and a distance between a column control circuit and memory cells according to the first embodiment.

FIG. 8 is a graph showing a relationship between the bias voltages and the distance between the column control circuit 2 (via lines) and memory cells MC in the nonvolatile memory according to the first embodiment.

In the present embodiment, an erasing voltage VWR (e.g., 4.0V) necessary for a resetting operation is applied to a selected bit line BL, an unselecting bit line voltage VUB (e.g., 0.5V) is applied to unselected bit lines BL, a selecting word line voltage VSS (e.g., 0V) is applied to a selected word line WL, a first unselecting word line voltage VUX (e.g., 3.2V), which is the aforementioned first unselecting voltage, is applied to unselected word lines WL farther from the column control circuit 2, and a second unselecting word line voltage VUX1, which is the aforementioned second unselecting voltage, is applied to unselected word lines WL closer to the column control circuit 2. The unselecting bit line voltage VUB is a voltage corresponding to the bias voltage Vα in the second comparative example, and has a value that would not cause erroneous writing/erasing in half-selected memory cells MC connected to a selected word line WL from a relation with the selecting word line voltage VSS. The unselecting word line voltages VUX and VUX1 are voltages corresponding to "V−Vα" in the second comparative example, and have a value that would not cause erroneous writing/erasing in half-selected memory cells MC connected to a selected bit line BL from a relation with the erasing voltage VWR.

The voltages VWR, VUB, VSS, VUX, and VUX1 shown in FIG. 6 represent the voltages applied to the word lines WL and bit lines BL when the memory cell MC encircled by the dotted-line circle A is selected. The voltages VSS, VUX, and VUX1 in the parentheses ( ) represent the voltages applied to the word lines WL when the memory cell MC encircled by the dotted-line circle B is selected.

In the second comparative example, in order to bring a memory cell MC far from the column control circuit 2 into a biased state necessary for a resetting operation, it is necessary to supply a sufficiently high erasing voltage V in consideration of voltage reduction to be caused by interconnection resistance, etc. through the selected bit line BL. As a result, a large forward current flows through half-selected memory cells MC closer to the column control circuit 2.

In the present embodiment, as shown in FIG. 8, a certain second unselecting word line voltage VUX1 is applied to the word lines located at positions closer to the column control circuit 2 where voltage reduction of the erasing voltage VWR is smaller, while a first unselecting word line voltage VUX lower than the second unselecting word line voltage VUX1 is applied to the word lines WL located at positions farther from the column control circuit 2 where voltage reduction of the erasing voltage VWR is larger. Therefore, when erasing data from a memory cell MC far from the column control circuit 2, it is possible not only to supply a sufficient erasing voltage VWR necessary for a resetting operation to the selected memory cell MC, but also to reduce the voltage VWR-VUX applied across both ends of the half-selected memory cells MC connected to the selected bit line BL, particularly the half-selected memory cells MC closer to the column control circuit 2, as compared with the second comparative example. Therefore, a current consumed by the half-selected memory cells MC can be reduced.

Hence, the present embodiment can generate such a biased state as necessary for a resetting operation in the selected memory cell while also being able to keep an appropriate biased state in the half-selected memory cells by stepping the unselecting word line voltages. Therefore, the present embodiment can provide a semiconductor memory with lower current consumption than the first and second comparative examples.

[Second Embodiment]

A nonvolatile memory according to a second embodiment includes a memory cell array 1 larger in the row (word line) direction.

In the first embodiment, the selecting word line voltage VSS is as dependent on the distance from the row control circuit 3 as the erasing voltage VWR is dependent on the distance from the column control circuit 2. Specifically, off-leakage currents caused by the half-selected memory cells MC connected to the selected word line WL influence the selecting word line voltage VSS to become higher as the distance from the row control circuit 3 becomes larger. This influence increases proportionately to the number of half-selected memory cells MC connected to the selected word line WL. That is, this influence is unignorable in a nonvolatile memory including a memory cell array 1 larger in the row direction.

Figure 9:
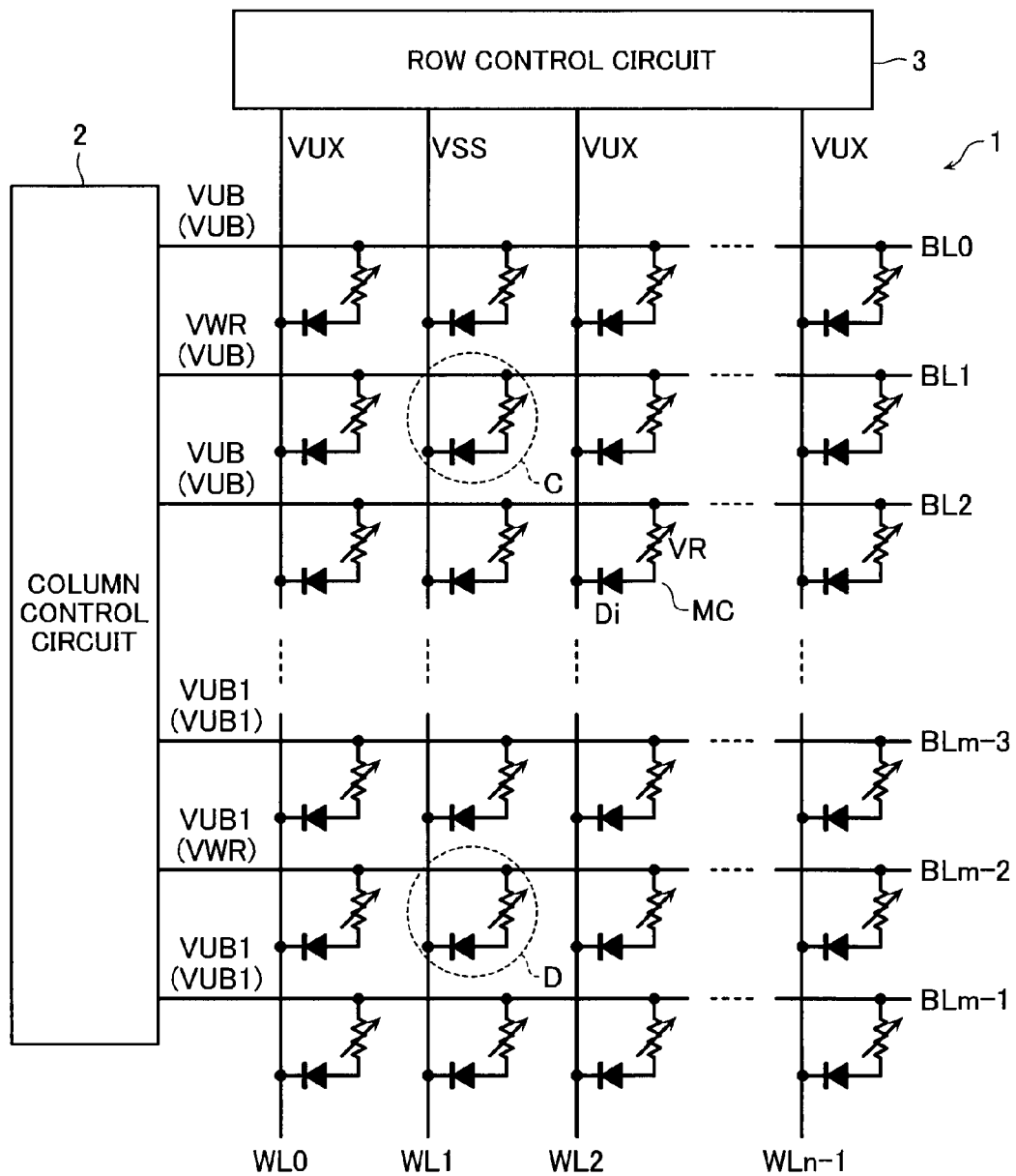
FIG. 9 is a circuit diagram of a memory cell array of a nonvolatile memory according to a second embodiment and peripheral circuits thereof.

Hence, the present embodiment applies voltages shown in FIG. 9 to the word lines WL and bit lines BL. The voltages VWR, VUB, VUB1, VSS, and VUX shown in FIG. 9 are the voltages applied to the word lines WL and bit lines BL when the memory cell MC encircled by the dotted-line circle C is selected. The voltages VWR, VUB, and VUB1 in the parentheses ( ) are the voltages applied to the bit lines BL when the memory cell MC encircled by the dotted-line circle D is selected.

Specifically, an erasing voltage VWR (e.g., 4.0V) necessary for a resetting operation is applied to a selected bit line BL, a first unselecting bit line voltage VUB (e.g., 0.5V), which is a third unselecting voltage, is applied to unselected bit lines BL closer to the row control circuit 3, a second unselecting bit line voltage VUB1, which is a fourth unselecting voltage higher than the first unselecting bit line voltage VUB, is applied to unselected bit lines BL farther from the row control circuit 3, a selecting word line voltage VSS (e.g., 0V) is applied to a selected word line WL, and an unselecting word line voltage VUX (e.g., 3.2V) is applied to unselected word lines WL.

Figure 10:
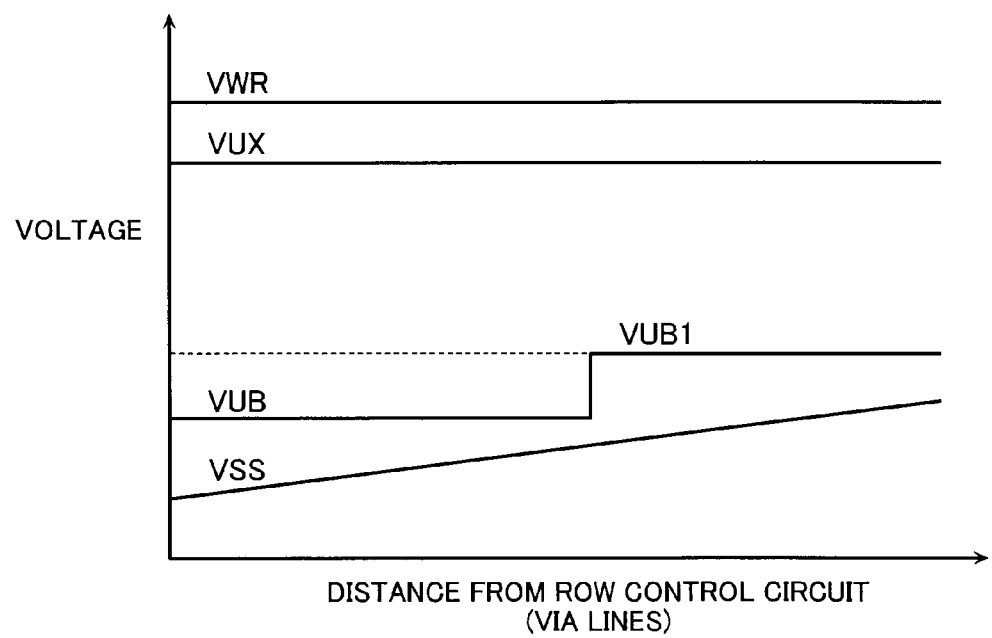
FIG. 10 is a graph showing a relationship between bias voltages and a distance between a row control circuit and memory cells according to the second embodiment.

FIG. 10 is a graph showing a relationship between the voltages and the distance between the row control circuit 3 (via lines) and memory cells MC in the nonvolatile memory according to the present embodiment.

A reverse bias "VUX−VUB" or "VUX−VUB1" is applied to the unselected memory cells MC. In this case, the reverse bias applied to the unselected memory cells MC farther from the row control circuit 3 is reduced by "VUB1−VUB" from when there is only one kind of unselecting bit line voltage VUB. Generally, when the reverse bias is reduced by "2×VUB", an off-leakage current caused by an unselected memory cell MC is improved by approximately one digit or two.

Meanwhile, a forward bias "VUB1−VSS" higher than "VUB−VSS" is applied across both ends of the memory cells MC farther from the row control circuit 3 among the half-selected memory cells MC connected to the selected word line WL, to proportionately increase off-leakage currents caused by such memory cells MC.

However, since the number of unselected memory cells MC is by far larger than the number of half-selected memory cells connected to the selected word line WL, the merit that off-leakage currents caused by the unselected memory cells MC decrease is larger than the demerit that off-leakage currents caused by the half-selected memory cells MC increase. This merit becomes larger as the memory cell array 1 is larger in the row direction.

Hence, the present embodiment can reduce a current consumed by a semiconductor memory as a whole by applying unselecting bit line voltages of different levels in accordance with the distance from the row control circuit.

[Third Embodiment]

A nonvolatile memory according to a third embodiment includes a memory cell array 1 large in the row (word line) direction and in the column (bit line) direction.

As explained in the first and second embodiments, the erasing voltage VWR and the selecting word line voltage VSS are dependent on the distance from the column control circuit 2 and the distance from the row control circuit 3, respectively. Influence of this distance dependency is unignorable in the nonvolatile memory according to the present embodiment which includes a memory cell array 1 large in the row direction and in the column direction.

Figure 11:
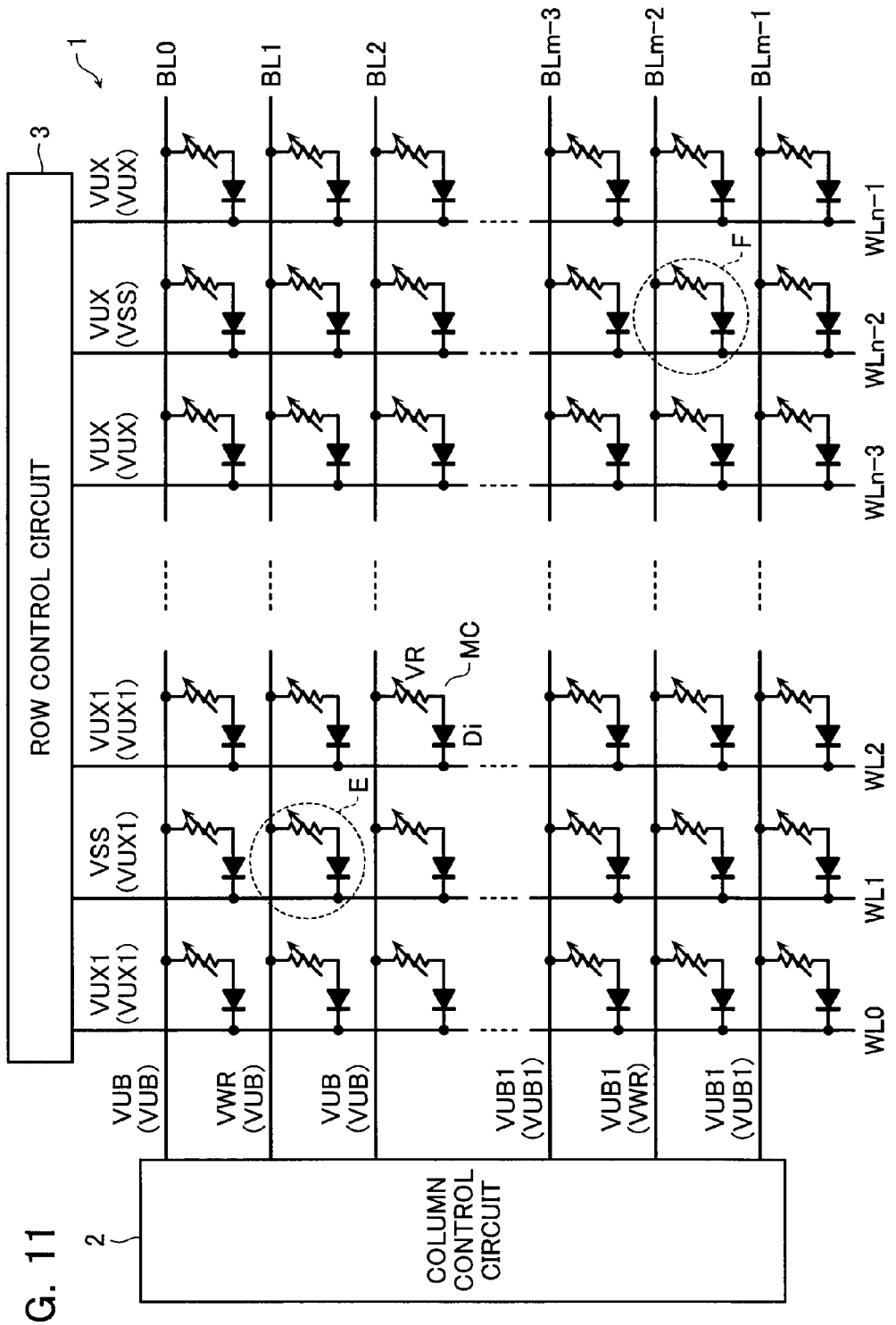
FIG. 11 is a circuit diagram of a memory cell array of a nonvolatile memory according to a third embodiment and peripheral circuits thereof.

Hence, the present embodiment applies voltages shown in FIG. 11 to the word lines WL and bit lines BL. The voltages VWR, VUB, VUB1, VSS, VUX, and VUX1 shown in FIG. 11 are the voltages applied to the word lines WL and bit lines BL when the memory cell MC encircled by the dotted-line circle E is selected. The voltages in the parentheses ( ) are the voltages applied to the word lines WL and bit lines BL when the memory cell MC encircled by the dotted-line circle F is selected.

Specifically, an erasing voltage VWR (e.g., 4.0V) necessary for a resetting operation is applied to a selected bit line BL, a first unselecting bit line voltage VUB (e.g., 0.5V) is applied to unselected bit lines BL closer to the row control circuit 3, a second unselecting bit line voltage VUB1 higher than the first unselecting bit line voltage VUB is applied to unselected bit lines BL farther from the row control circuit 3, a selecting word line voltage VSS (e.g., 0V) is applied to a selected word line WL, a first unselecting word line voltage VUX (e.g., 3.2V) is applied to unselected word lines WL farther from the column control circuit 2, and a second unselecting word line voltage VUX1 higher than the first unselecting word line voltage VUX is applied to unselected word lines WL closer to the column control circuit 2.

Figure 12:
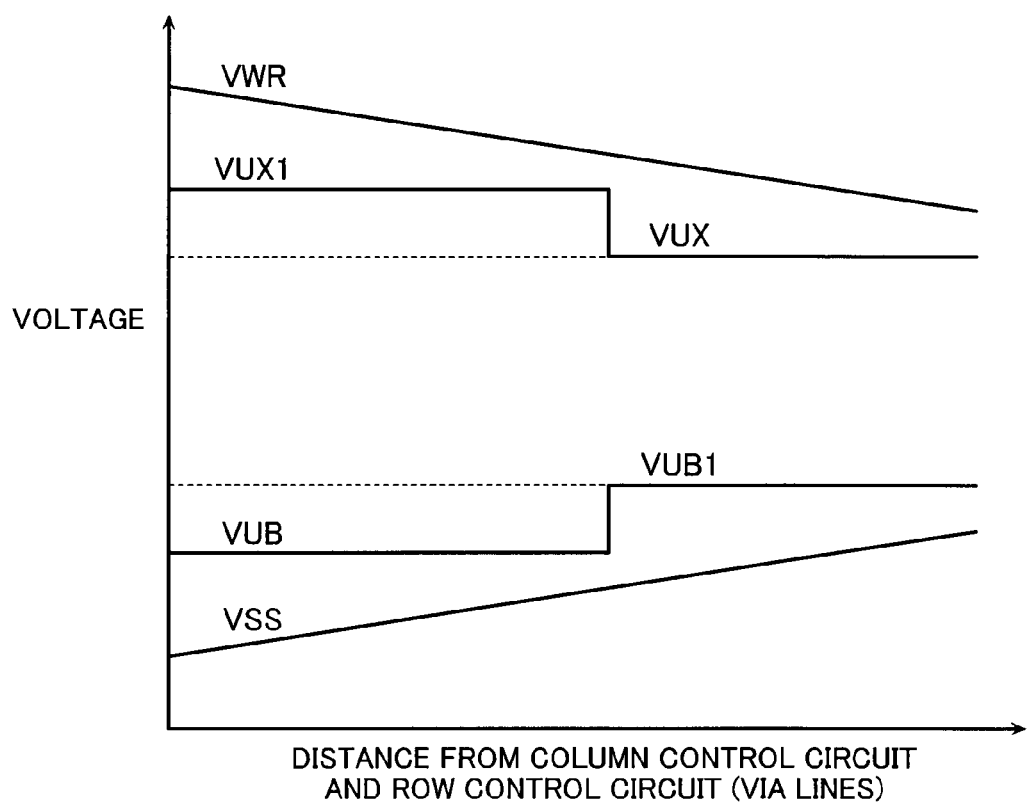
FIG. 12 is a graph showing a relationship between bias voltages and a distance between a column control circuit or a row control circuit and memory cells according to the third embodiment.

FIG. 12 is a graph showing a relationship between the voltages and the distance between the column control circuit 2 or the row control circuit 3 (via lines) and memory cells in the nonvolatile memory according to the present embodiment.

The present embodiment can supply a voltage "VWR−VSS" necessary for a resetting operation to a memory cell MC far from the row control circuit 3 and the column control circuit 2 such as the one shown in the dotted-line circle F of FIG. 11. Further, like the first embodiment, the present embodiment can supply an appropriate forward bias to the half-selected memory cells MC connected to the selected bit line BL or the selected word line WL.

However, according to the present embodiment, the reverse bias in the unselected memory cells MC at the crosspoints "VUX1−VUB" or "VUX−VUB1" is larger than when only one kind of unselecting bit line voltage VUB is applied to the unselected bit lines BL and only one kind of unselecting word line voltage VUX is applied to the unselected word lines WL. Off-leakage currents caused by the unselected memory cells MC are logarithmically proportional to the increase of the reverse bias. Therefore, when employing the present embodiment, it is necessary to be cautious that the total off-leakage current will be large if the memory cell array 1 is too large.

[Fourth Embodiment]

Figure 13:
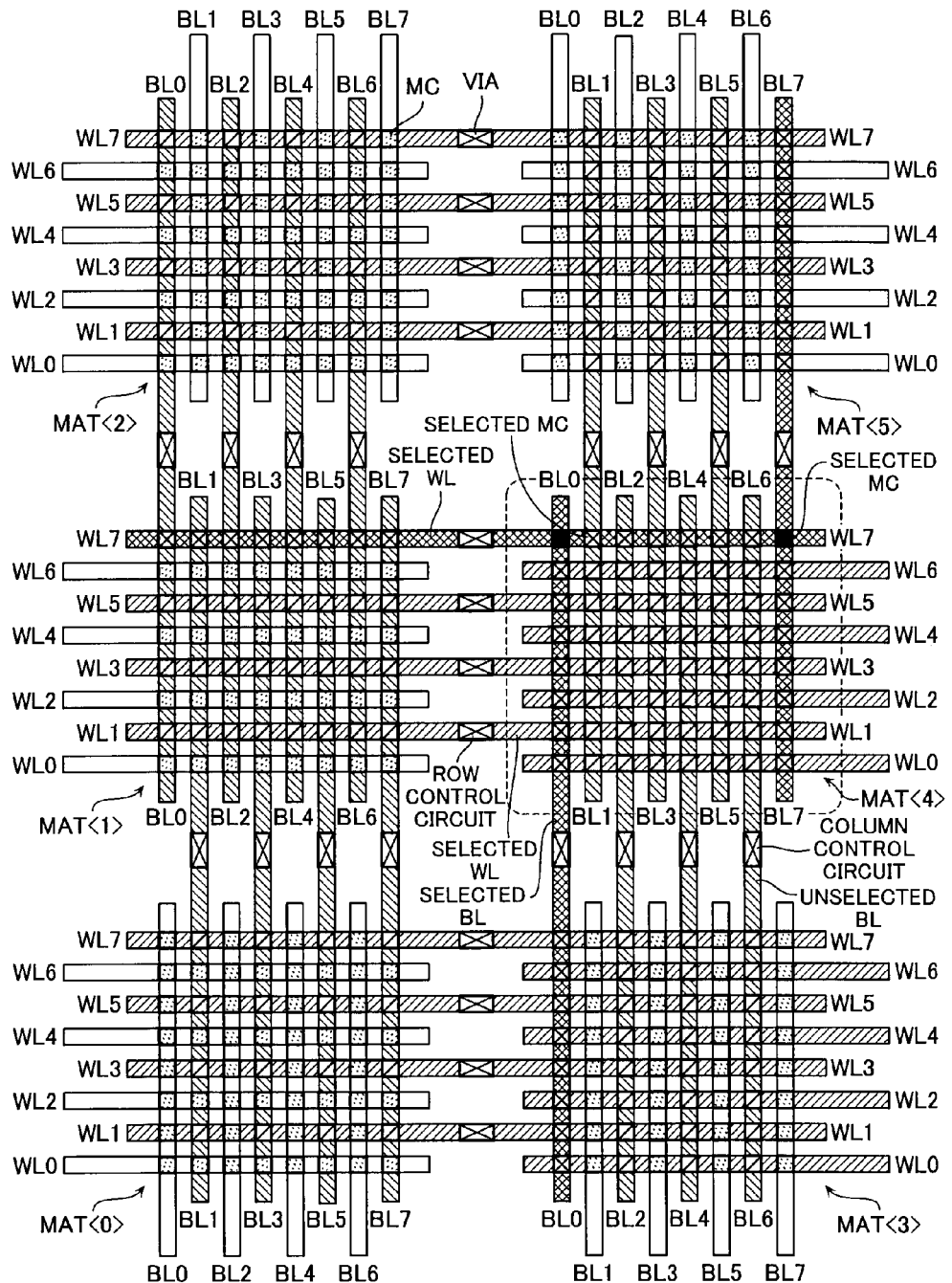
FIG. 13 is a circuit diagram of a memory cell array of a nonvolatile memory according to a fourth embodiment and peripheral circuits thereof.
Figure 14:
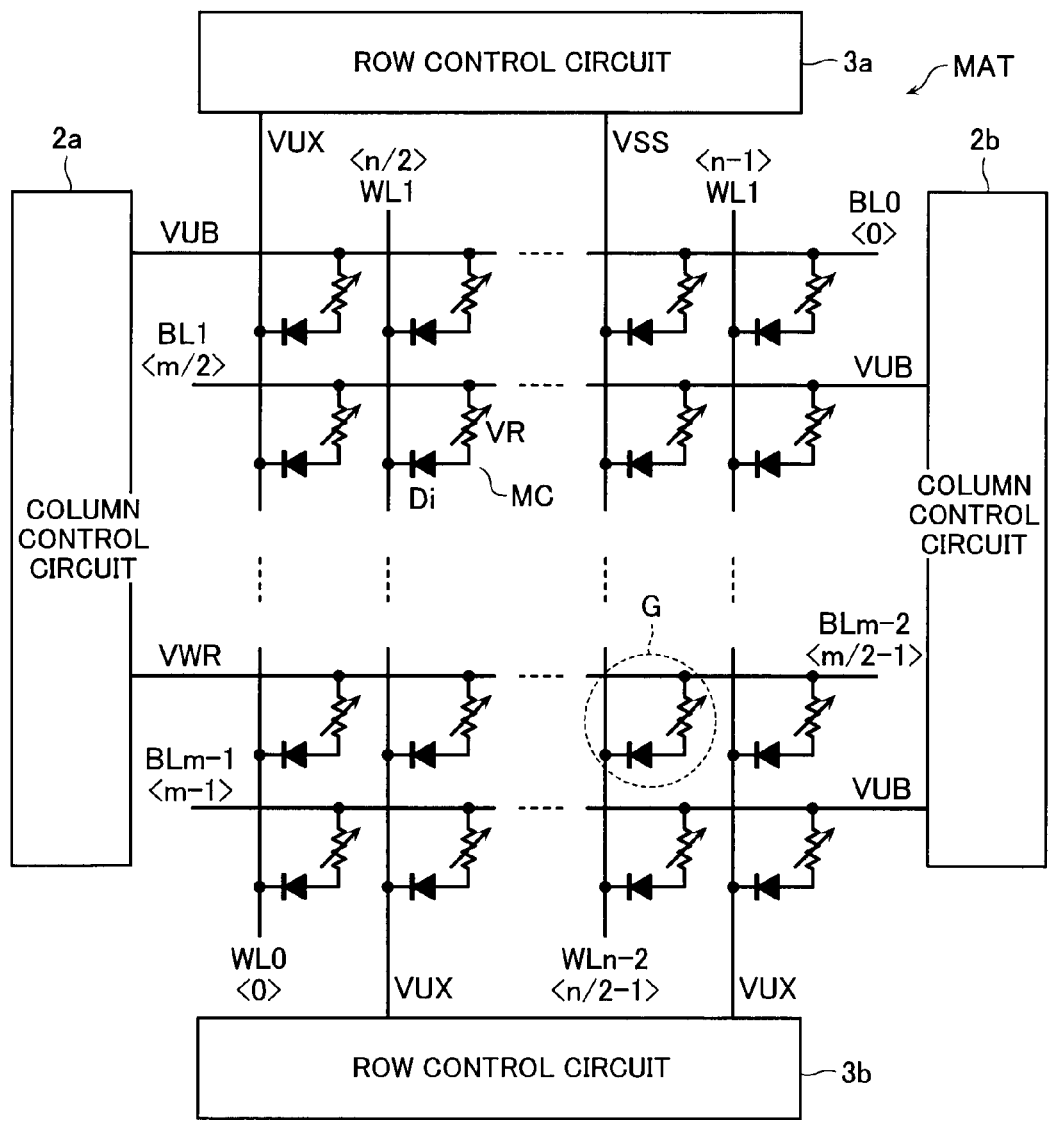
FIG. 14 is a diagram showing a positional relationship among MATs, column control circuits, and row control circuits according to the fourth embodiment.

As shown in FIG. 13, a memory cell array 1 of a nonvolatile memory according to a fourth embodiment is divided into three rows and two columns of a total of six unit cell arrays (hereinafter referred to as "MAT"). As shown in FIG. 14, there are provided for each MAT a column control circuit 2a or a first-second line control circuit at one end (third end) of the bit lines BL, and a column control circuit 2b or a second-second line control circuit at the other end (fourth end) of the bit lines BL. There are also provided for each MAT a row control circuit 3a or a first-first line control circuit at one end (first end) of the word lines WL, and a row control circuit 3b or a second-first line control circuit at the other end (second end) of the word lines WL. The column control circuits 2a and 2b select and drive bit lines BLm (where m is an even number; hereinafter may be referred to as "bit lines BLe"), which are a first group of second lines, and bit lines BLm+1 (hereinafter may be referred to as "bit lines BLo"), which are a second group of second lines, respectively. The row control circuits 3a and 3b select and drive word lines WLn (where n is an even number; hereinafter may be referred to as "word lines WLe"), which are a first group of first lines, and word lines WLn+1 (hereinafter may be referred to as "word lines WLo"), which are a second group of first lines, respectively. The column control circuits 2a and 2b are shared between two MATs adjoining in the column direction for a reason related to the layout spaces of the column control circuits 2a and 2b, the row control circuits 3a and 3b, and the via lines, etc. The row control circuits 3a and 3b are shared between two MATs adjoining in the row direction for the same reason.

A case of selecting from one MAT, a memory cell MC encircled by the dotted-line circle G shown in FIG. 14 will now be explained.

Here, assume that, like the third embodiment, a selecting word line voltage VSS is applied to a selected word line WL, a second unselecting word line voltage VUX1 is applied to unselected word lines WL closer to the column control circuit 2a, a first unselecting word line voltage VUX lower than the second unselecting word line voltage VUX1 is applied to unselected word lines WL farther from the column control circuit 2a, an erasing voltage VWR is applied to a selected bit line BL, a first unselecting bit line voltage VUB is applied to unselected bit lines BL closer to the row control circuit 3a, and a second unselecting bit line voltage VUB1 higher than the first unselecting bit line voltage VUB is applied to unselected bit lines BL farther from the row control circuit 3a.

In this case, among unselected memory cells connected to a word line WLn−1 farthest from the column control circuit 2a, memory cells MC connected to the bit lines BLe (hereinafter referred to as "memory cells MCe") and memory cells MC connected to the bit lines BLo (hereinafter referred to as "memory cells MCo") have different bias voltages applied thereto; the problem here is that either group of the memory cells MCe and the memory cells MCo is not under an ideal bias voltage though the other group is under an ideal bias voltage. Consider a case that a word line WL7 and bit lines BL0 and BL7 of the MAT <4> are selected in the memory cell array 1 shown in FIG. 13. In this case, half-selected memory cells MC exist in the MAT <1> adjoining the selected MAT <4> and in the MATs <3> to <5>, and unselected memory cells MC exist in the MATs <0> to <5>. These half-selected memory cells MC and unselected memory cells MC cause a large off-leakage current. Therefore, the selecting word line voltage VSS applied to the selected word line WL7 and the erasing voltage VWR applied to the selected bit lines BL0 and BL7 become largely position-dependent to make the above-described problem significant.

Hence, row addresses or first addresses of the word lines WL are set as indicated in the parentheses < > of FIG. 14 instead of being set in the order closer to the column control circuit 2a. Specifically, the n/2 number of word lines WLe connected to the row control circuit 3a are assigned row addresses <0> to <n/2−1> in the order closer to the column control circuit 2a. The n/2 number of word lines WLo connected to the row control circuit 3b are assigned row addresses <n/2> to <n−1> in the order closer to the column control circuit 2a. The first unselecting word line voltage VUX and the second unselecting word line voltage VUX1 are supplied based on the row addresses assigned in this way.

Figure 15:
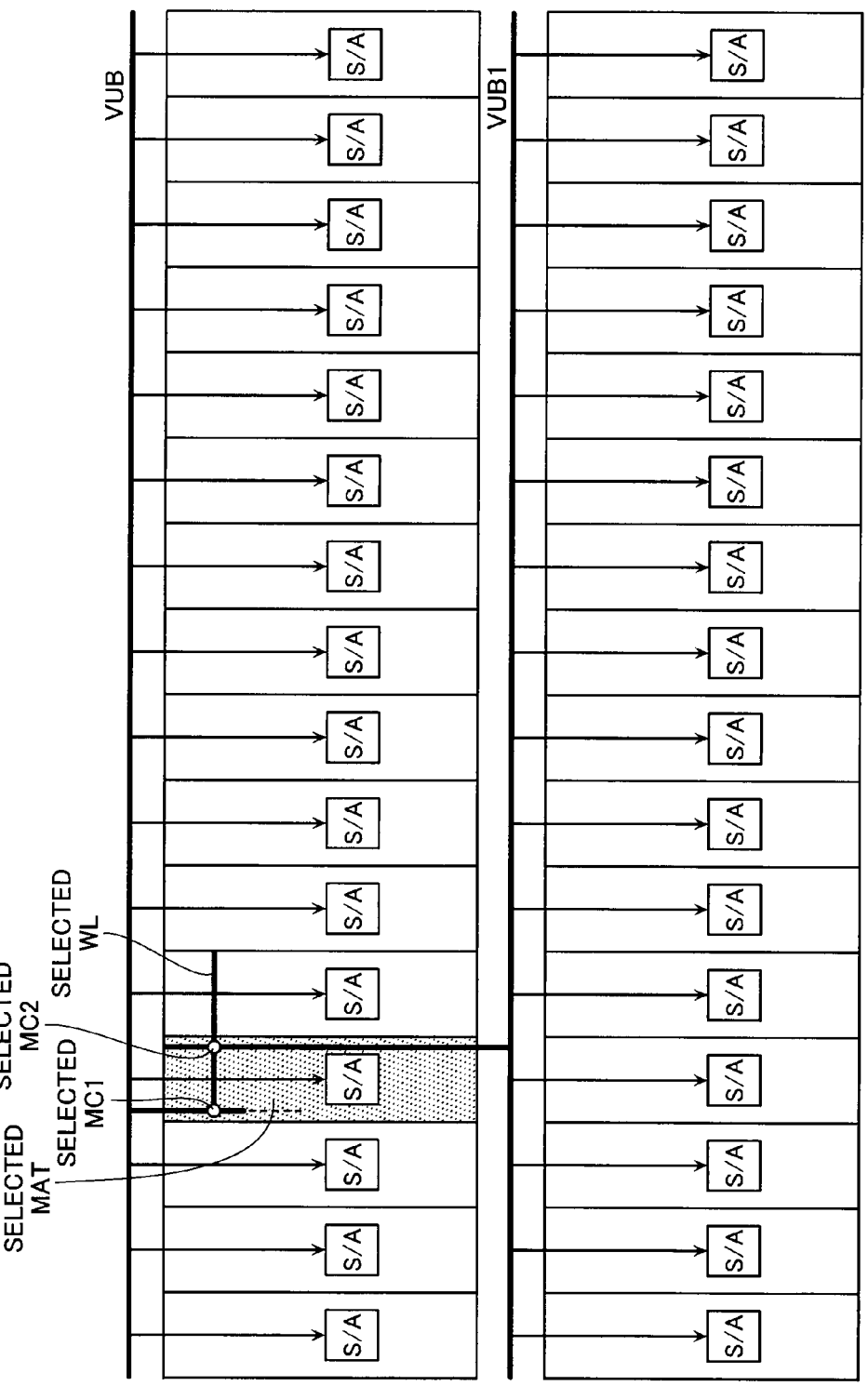
FIG. 15 is a diagram for explaining address assignment in the memory cell array structure according to the fourth embodiment.

Meanwhile, column addresses or second addresses of the bit lines BL are set as indicated in the parentheses < > of FIG. 14 instead of being set in the order closer to the row control circuit 3a. Specifically, the m/2 number of bit lines BLe connected to the column control circuit 2a are assigned column addresses <0> to <m/2−1> in the order closer to the row control circuit 3a. The m/2 number of bit lines BLo connected to the column control circuit 2b are assigned column addresses <m/2> to <m−1> in the order closer to the row control circuit 3a. In this case, the first unselecting bit line voltage VUB and the second unselecting bit line voltage VUB1 are serially supplied as shown in FIG. 15 based on the column addresses assigned in this way. That is, as shown in FIG. 15, a memory cell MC1 and a memory cell MC2 designated by a selected MAT and a selected word line WL are serially accessed, and hence the number of memory cells MC accessible at a time is reduced to half. In this case, however, a resetting operation that is not dependent on the position of the selected memory cell MC can be realized.

[Fifth Embodiment]

Next, a pulse generator 9 for realizing the first to fourth embodiments will be explained.

Figure 16:
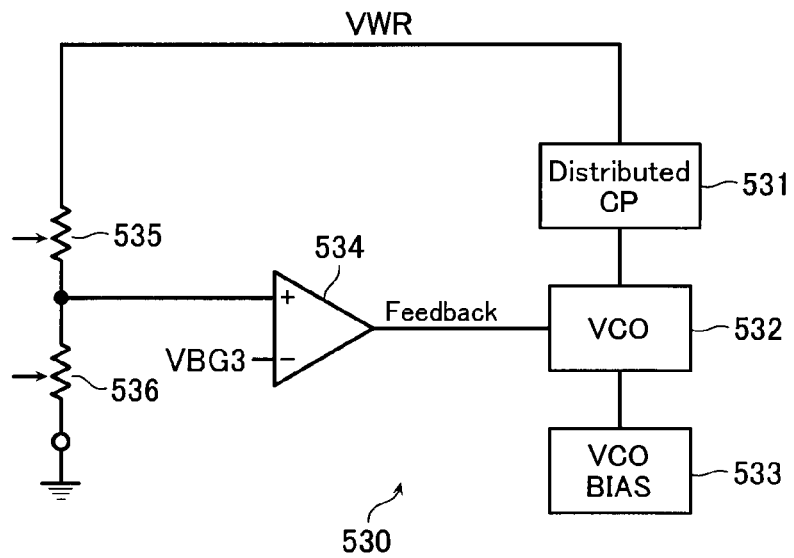
FIG. 16 is a block diagram showing an erasing voltage generating circuit of a nonvolatile memory according to a fifth embodiment.

FIG. 16 is a circuit diagram showing a part of the pulse generator 9.

The pulse generator 9 according to the present embodiment includes an erasing voltage generating circuit 530.

The erasing voltage generating circuit 530 is a circuit configured to generate the erasing voltage VWR to be supplied to a selected bit line BL. The erasing voltage generating circuit 530 includes a charge pump 531, a VCO (Voltage-Controlled Oscillator) 532, a VCO bias circuit 533, an operational amplifier 534, and variable resistors 535 and 536. The charge pump 531 generates an erasing voltage VWR by stepping up a supplied voltage. The erasing voltage VWR is divided by the variable resistors 535 and 536 connected in series, and then input to a non-inverting input terminal (+) of the operational amplifier 534. The operational amplifier 534 compares the divisional voltage of the erasing voltage VWR with a reference voltage VBG3 input to its inverting input terminal (−), thereby generating a feedback signal corresponding to the erasing voltage VWR. The VCO 532 is driven by a bias voltage supplied by the VCO bias circuit 533 to activate the charge pump 531 based on the feedback signal supplied by the operational amplifier 534. With this configuration, the erasing voltage VWR can be stably generated from the reference voltage VBG3.

Figure 17:
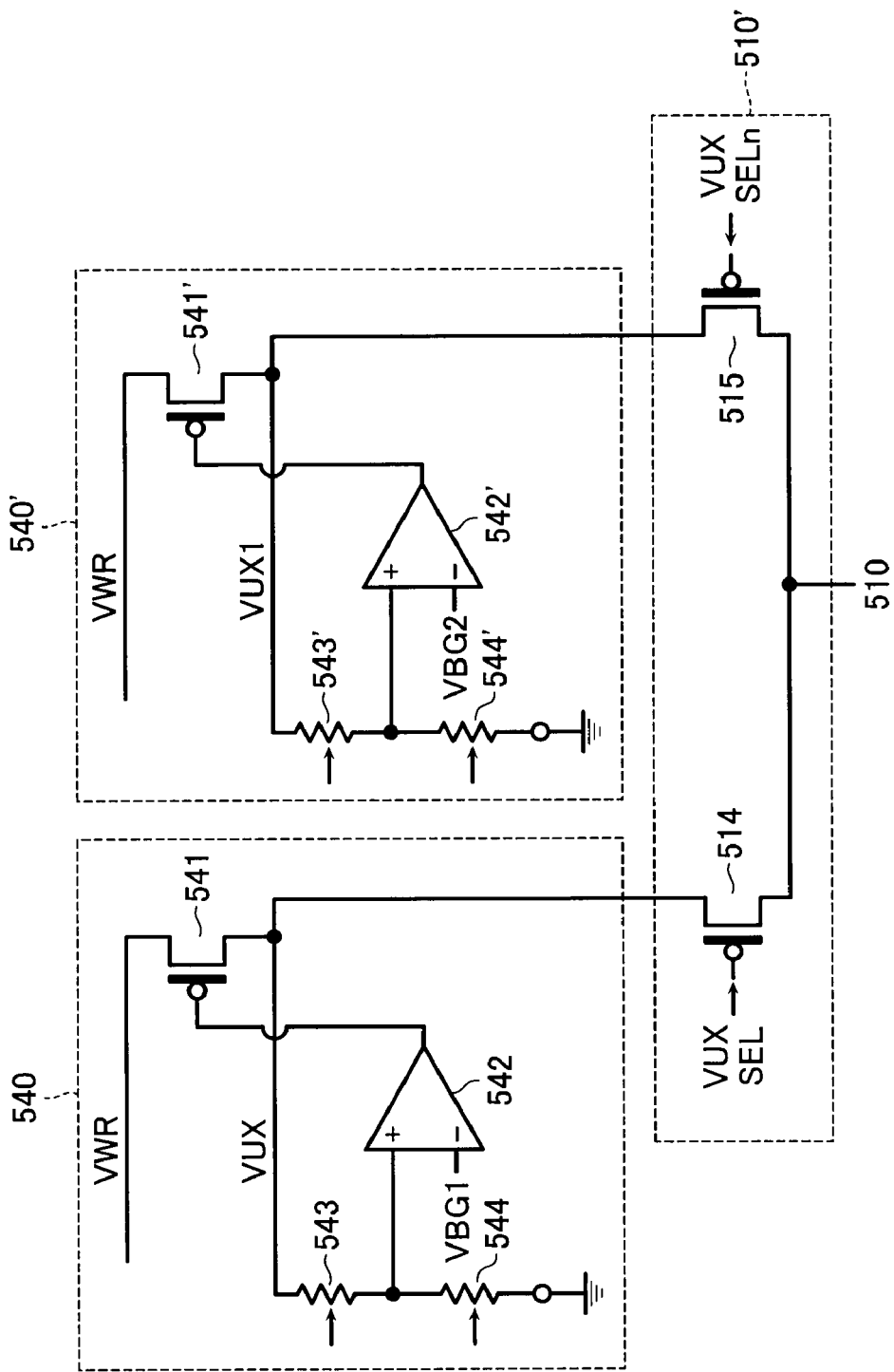
FIG. 17 is a circuit diagram showing an unselecting word line voltage generating circuit of the nonvolatile memory according to the fifth embodiment.

FIG. 17 shows a part of the pulse generator 9 and is an equivalent circuit diagram of a first unselecting word line voltage generating circuit 540, a second unselecting word line voltage generating circuit 540', and an unselecting word line voltage switching circuit 510'.

The first unselecting word line voltage generating circuit 540 is a circuit configured to generate the first unselecting word line voltage VUX from the erasing voltage VWR. The second unselecting word line voltage generating circuit 540' is a circuit configured to generate the unselecting word line voltage VUX1 from the erasing voltage VWR supplied by the erasing voltage generating circuit 530. The unselecting word line voltage generating circuit 540 includes a PMOS transistor 541, an operational amplifier 542, and variable resistors 543 and 544. The PMOS transistor 541 has the erasing voltage VWR supplied to its source, and outputs the unselecting word line voltage VUX from its drain. This unselecting word line voltage VUX is divided by the variable resistors 543 and 544 connected in series, and then input to a non-inverting input terminal (+) of the operational amplifier 542. The operational amplifier 542 generates a feedback signal corresponding to a reference voltage VBG1 input to its inverting input terminal (−). The PMOS transistor 541 is controlled by this feedback signal. With this configuration, the unselecting word line voltage VUX can be stably generated from the erasing voltage VWR.

The second unselecting word line voltage generating circuit 540' is a circuit configured to generate the second unselecting word line voltage VUX1 from the erasing voltage VWR supplied by the erasing voltage generating circuit 530. The unselecting word line voltage generating circuit 540' includes a PMOS transistor 541', an operational amplifier 542', and variable resistors 543' and 544'. The PMOS transistor 541' has the erasing voltage VWR supplied to its source, and outputs the unselecting word line voltage VUX1 from its drain. The unselecting word line voltage VUX1 is divided by the variable resistors 543' and 544' connected in series, and then input to a non-inverting input terminal (+) of the operational amplifier 542'. The operational amplifier 542' generates a feedback signal corresponding to a reference voltage VBG2 input to its inverting input terminal (−). The PMOS transistor 541' is controlled by this feedback signal. With this configuration, the unselecting word line voltage VUX1 can be stably generated from the erasing voltage VWR.

The unselecting word line voltage switching circuit 510' is a part of a word line driver WLDRV to be described later, and includes a PMOS transistor 514 configured to select the first unselecting word line voltage VUX supplied by the first unselecting word line voltage generating circuit 540, and a PMOS transistor 515 configured to select the second unselecting word line voltage VUX1 supplied by the second unselecting word line voltage generating circuit 540'. The PMOS transistor 514 is on/off controlled by an unselecting word line voltage selecting signal VUXSELn, which is based on negative logic. On the other hand, the PMOS transistor 515 is on/off controlled by an unselecting word line voltage selecting signal VUXSEL, which is based on logic opposite to the unselecting word line voltage selecting signal VUXSELn. With this configuration, either one of the first and second unselecting word line voltages VUX and VUX1 can be selectively applied to the word lines WL.

Figure 18:
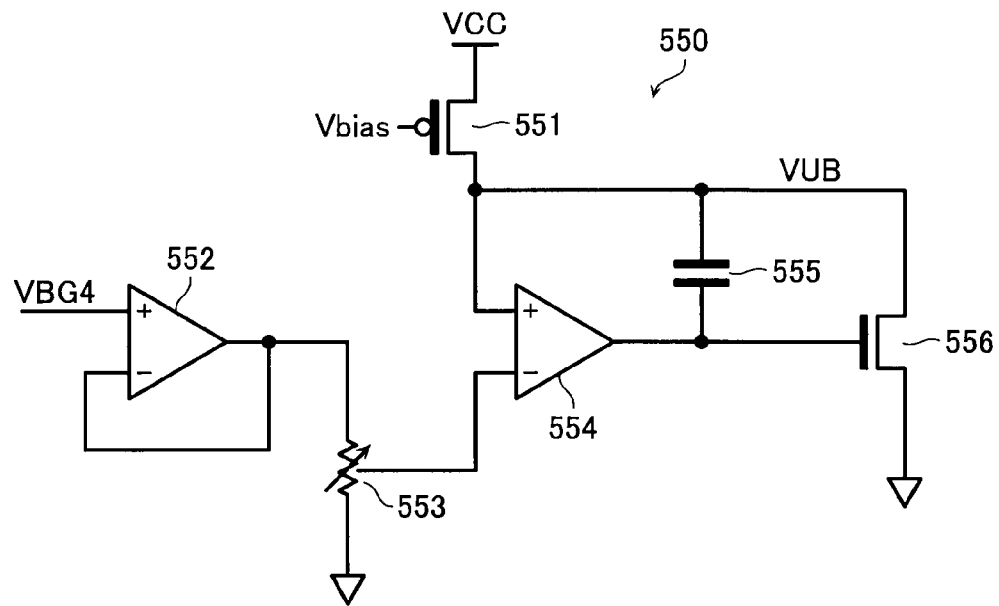
FIG. 18 is a circuit diagram showing an unselecting bit line voltage generating circuit of the nonvolatile memory according to the fifth embodiment.

FIG. 18 shows a part of the pulse generator 9, and is an equivalent circuit diagram of a first unselecting bit line voltage generating circuit 550.

The first unselecting bit line voltage generating circuit 550 includes a PMOS transistor 551, operational amplifiers 552 and 554, a variable resistor 553, a capacitor 555, and an NMOS transistor 556.

The PMOS transistor 551 adjusts a supplied voltage VCC based on a certain bias signal Vbias and outputs the first unselecting bit line voltage VUB. The first unselecting bit line voltage VUB is input to a non-inverting input terminal (+) of the operational amplifier 554. The operational amplifier 552 constitutes a voltage follower circuit which receives a certain reference voltage VBG4 as input. Output of this operational amplifier 552 is divided by the variable resistor 553 and then input to the inverting input terminal (−) of the operational amplifier 554. A voltage regulator circuit is constituted with the output of the operational amplifier 554 connected to the gate of the NMOS transistor 556, the non-inverting input terminal (+) of the operational amplifier 554 connected to the source of the NMOS transistor 556, and the capacitor 555 inserted between the output and non-inverting input terminal (+) of the operational amplifier 554. With this configuration, the supplied voltage VCC can be stably stepped down to the first unselecting bit line voltage VUB upon supply of an appropriate control signal Vbias.

Though not illustrated, a circuit for generating the second unselecting bit line voltage VUB1 can be constituted by appropriately changing the reference voltage VBG4 input to the non-inverting input terminal (+) of the operational amplifier 552.

Figure 19:
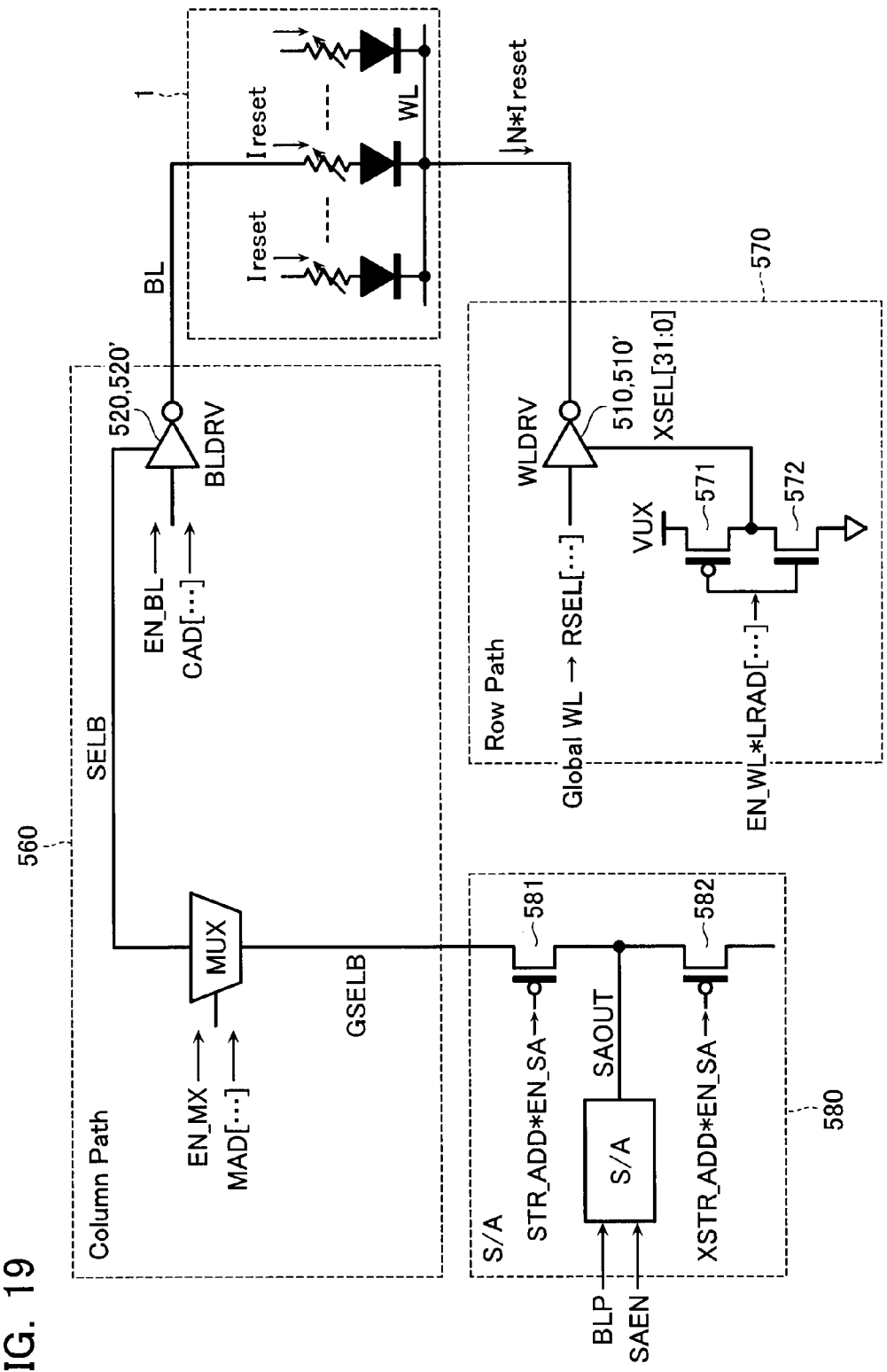
FIG. 19 is a diagram showing paths for voltage supply to the memory cells of the nonvolatile memory according to the fifth embodiment.

FIG. 19 is a diagram for explaining paths through which the selecting bit line voltage and the selecting word line voltage are supplied to a selected memory cell.

FIG. 19 shows a column path 560 through which the selecting bit line voltage SELB is supplied to a selected bit line BL, a row path 570 through which a selecting word line voltage XSEL is supplied to a selected word line WL, and a sense amplifier unit 580 configured to supply a sense amplifier output SAOUT to the memory cell array 1 through the column path 560.

The sense amplifier unit 580 is shared between two MAT groups adjoining in a certain direction. The sense amplifier unit 580 includes a sense amplifier circuit S/A controlled by a bit line pre-charge signal BLP for giving a timing to pre-charge a bit line BL in a reading operation to a memory cell MC and by a sense amplifier circuit enable signal SAEN for activating the sense amplifier circuit S/A. The sense amplifier unit 580 also includes a transistor 581 to be connected to a global selected bit line GSELB in one MAT group (hereinafter referred to as "first MAT group"), and a transistor 582 to be connected to the sense amplifier circuit S/A and a global bit line in the other MAT group (hereinafter referred to as "second MAT group"). The transistor 581 is controlled by a MAT group address signal STR_ADD for selecting the first MAT group and a sense amplifier unit enable signal EN_SA. The transistor 582 is controlled by a MAT group address signal XSTR_ADD for selecting the second MAT group and a sense amplifier unit enable signal EN_SA.

The column path 560 includes a multiplexer MUX configured to supply a voltage supplied through a global bit line GSELB to the selecting bit line voltage SELB selectively, and a bit line driver BLDRV configured to supply the selecting bit line voltage SELB to a bit line BL. The multiplexer MUX is provided for each MAT, and controlled by a multiplexer enable signal EN_MX for activating the multiplexer MUX and a MAT address MAD that selects a MAT. The bit line driver BLDRV is provided for each column, and controlled by a bit line driver enable signal EN_BL for activating the bit line driver BLDRV and a column address CAD that selects a column. The bit line driver BLDRV is driven by the selecting bit line voltage SELB to supply a selected bit line BL with a current Ireset necessary for a resetting operation on a selected memory cell.

The column path 570 includes a word line driver WLDRV configured to supply the selecting word line voltage XSEL to a selected word line WL, a transistor 571 configured to supply the unselecting word line voltage VUX to the word line driver WLDRV, and a transistor 572 configured to supply the selecting word line voltage VSS to the word line driver WLDRV. The transistors 571 and 572 are based on opposite logics, and controlled by a word line driver enable signal EN_WL for activating the word line driver WLDRV and a local row address signal LRAD that selects a local row.

Figure 28:
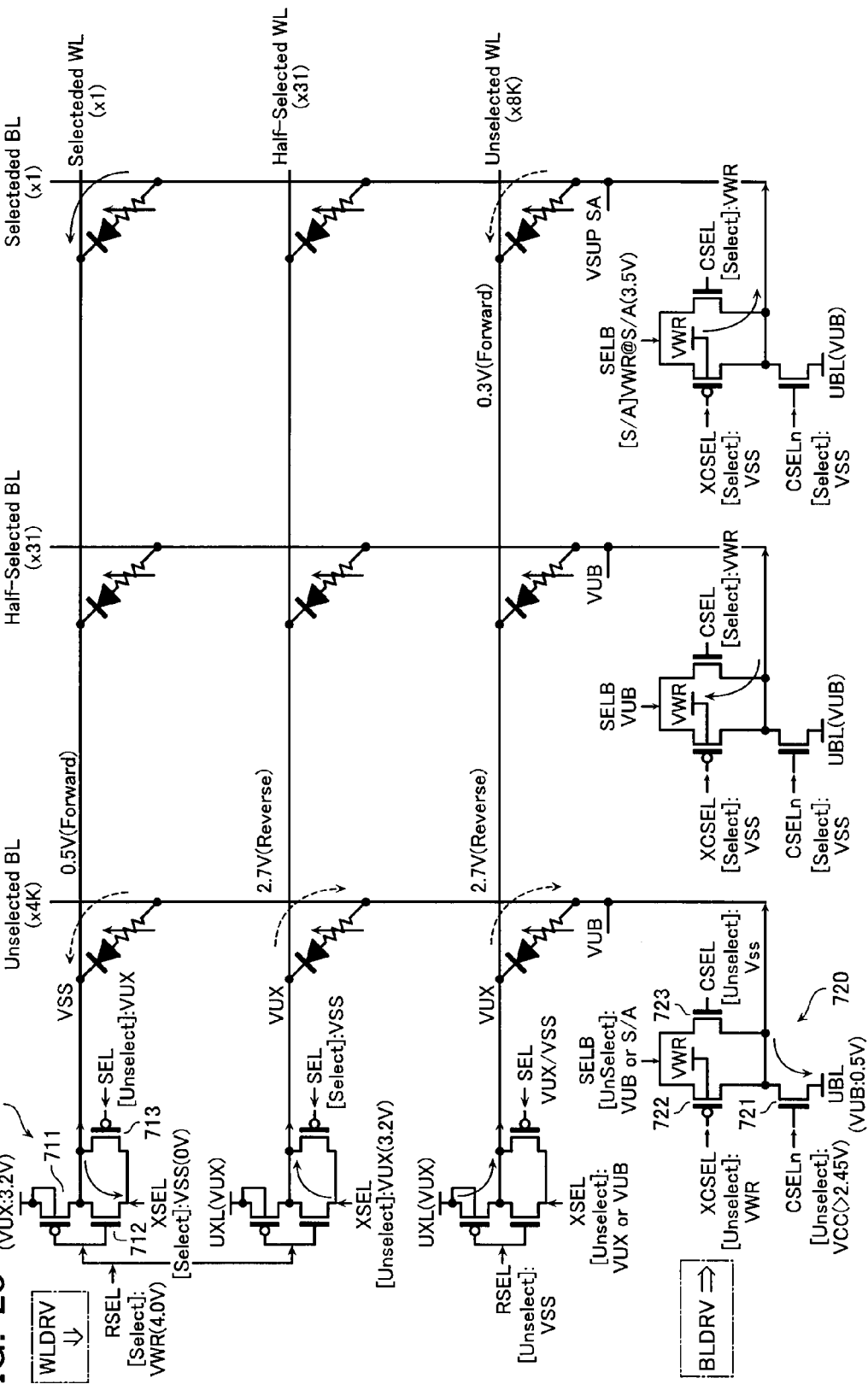
FIG. 28 is a circuit diagram showing a memory cell array, word line drivers, and bit line drivers of a nonvolatile memory according to a third comparative example.

FIG. 28 shows a circuit diagram of the memory cell array 1, the word line driver WLDRV, and the bit line driver BLDRV when there are provided only one kind of unselecting word line voltage and only one kind of unselecting bit line voltage.

A word line driver 710 (WLDRV) includes three transistors, namely a PMOS transistor 711, an NMOS transistor 712, and a PMOS transistor 713. The PMOS transistor 711 is connected between a power wire of the unselecting word line voltage UXL (VUX) (e.g., 3.2V) and a word line WL. The NMOS transistor 712 and the PMOS transistor 713 are connected to a power wire through which the word line selecting voltage XSEL is supplied and to the word line WL. A row selecting signal RSEL based on positive logic is input to the gates of the PMOS transistor 711 and NMOS transistor 712. The row selecting signal RSEL is a signal that becomes the potential level of the erasing voltage VWR (e.g., 4.0V) in a selecting mode and the potential level of the selecting word line voltage VSS (e.g., 0V) in an unselecting mode. A selecting signal SEL based on positive logic is input to the gate of the PMOS transistor 713. The selecting signal SEL is a signal that becomes the potential level of the selecting word line voltage VSS (e.g., 0V) in a selecting mode and the potential level of the unselecting word line voltage VUX (e.g., 3.2V) in an unselecting mode.

The word line driver 710 having the above configuration applies the selecting word line voltage VSS to the word line WL when the row and the word line WL are selected. On the other hand, when the row is selected but the word line WL is not selected or when neither the row nor the word line WL is selected, the word line driver 710 applies the unselecting word line voltage VUX to the word line WL.

A bit line driver 720 (BLDRV) includes three transistors, namely an NMOS transistor 721, a PMOS transistor 722, and an NMOS transistor 723. The NMOS transistor 721 is connected between a power wire of the unselecting bit line voltage UBL (VUB) (e.g., 0.5V) and a bit line BL. The PMOS transistor 722 and the NMOS transistor 723 are connected to a power wire through which the bit line selecting voltage SELB is supplied and to the bit line BL. A column selecting signal CSELn based on positive logic is input to the gate of the NMOS transistor 721. The column selecting signal CSELn is a signal that becomes the potential level of a certain supplied voltage VCC (e.g., 2.45V or higher) in a selecting mode and the potential level of the selecting word line voltage VSS in an unselecting mode. An opposite column selecting signal XCSEL based on negative logic and an erasing voltage VWR are input to the gate and back gate of the PMOS transistor 722 respectively. The opposite column selecting signal XCSEL is a signal that becomes the potential level of the selecting word line voltage VSS in a selecting mode and the potential level of the erasing voltage VWR in an unselecting mode. A selecting signal CSEL which is based on opposite logic to the column selecting signal CSELn and based on positive logic is input to the gate of the NMOS transistor 723.

The bit line driver 720 having the above configuration applies the erasing voltage VWR to the bit line BL when the bit line BL is selected. On the other hand, when the bit line BL is not selected, the bit line driver 720 applies the unselecting bit line voltage VUB to the bit line BL. In a data reading operation, the bit line driver 720 applies the output SAOUT (e.g., 3.5V) of a sense amplifier circuit to the bit line BL through the PMOS transistor 722 and the NMOS transistor 723.

Figure 20:
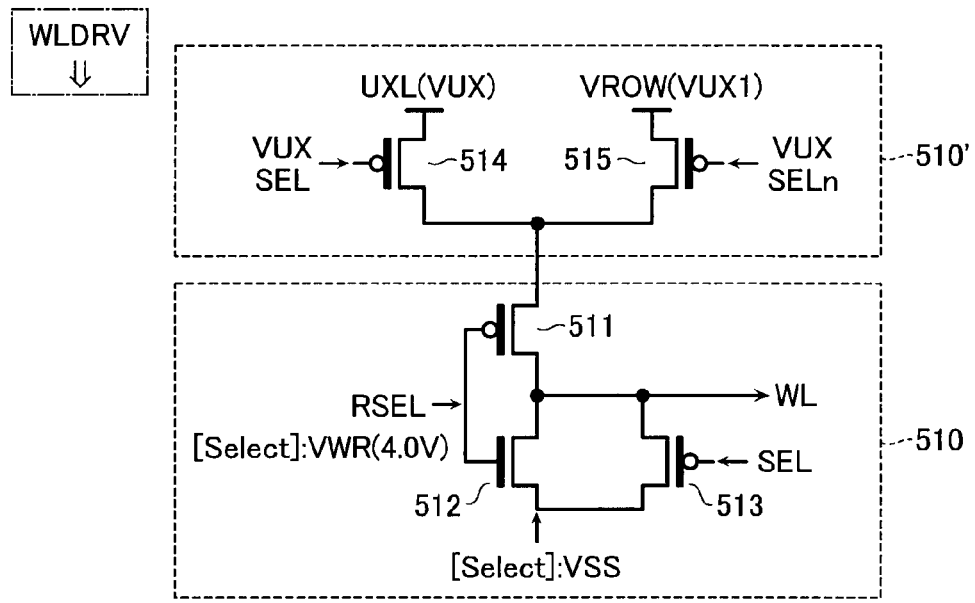
FIG. 20 is a circuit diagram showing a word line driver of the nonvolatile memory according to the fifth embodiment.

FIG. 20 is a circuit diagram of a word line driver WLDRV according to the present embodiment. A partial circuit 510 in FIG. 20 is the same as the word line driver 710 in FIG. 28.

In addition to including the word line driver 710 shown in FIG. 28, the present word line driver WLDRV further includes an unselecting word line voltage switching circuit 510' including two PMOS transistors 514 and 515, which are a first transistor and a second transistor respectively, in order to be able to select between the two unselecting word line voltages VUX and VUX1.

The PMOS transistor 514 is provided between a power wire of the unselecting word line voltage VUX and a PMOS transistor 511 (corresponding to the PMOS transistor 711 of FIG. 28), and controlled by an unselecting word line voltage selecting signal VUXSEL based on negative logic. The PMOS transistor 515 is provided between a power wire of the unselecting word line voltage VUX1 and the PMOS transistor 511, and controlled by an unselecting word line voltage selecting signal VUXSELn based on opposite logic to the unselecting word line voltage selecting signal VUXSEL.

According to this configuration, when the row selecting signal RSEL is deactivated and the unselecting word line voltage selecting signal VUXSEL is activated, the unselecting word line voltage VUX is supplied to the word line WL. On the other hand, when the row selecting signal RSEL is deactivated and the unselecting word line voltage selecting signal VUXSELn is activated, the unselecting word line voltage VUX1 is supplied to the word line WL.

Figure 21:
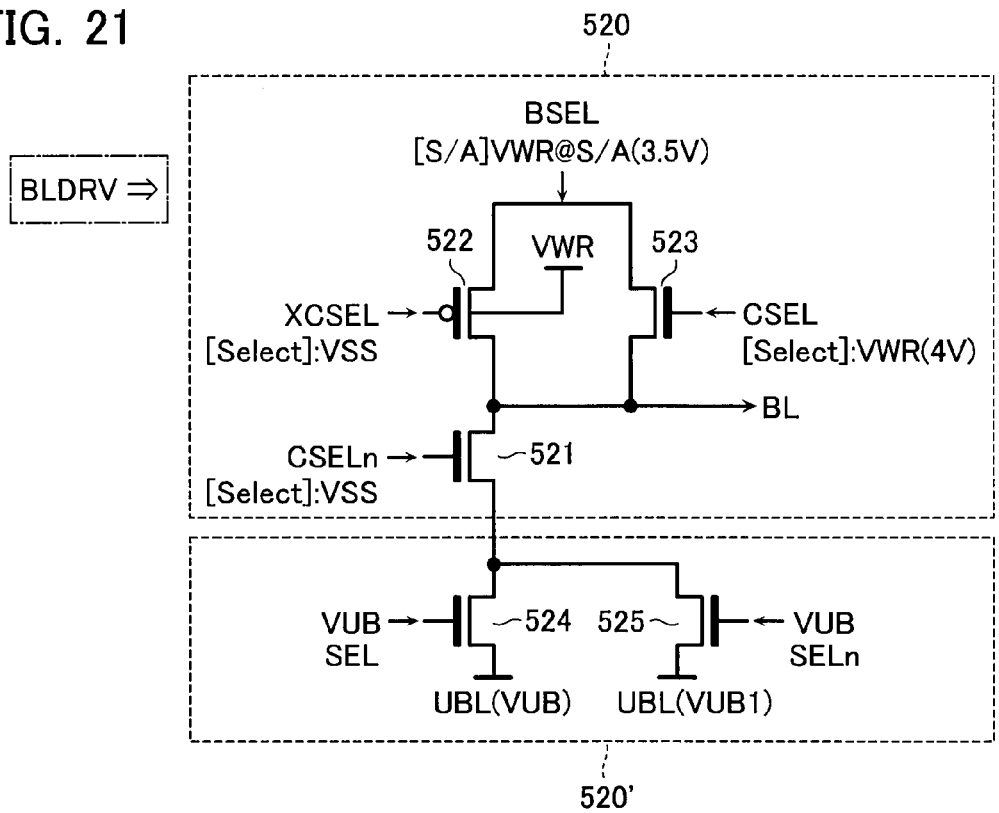
FIG. 21 is a circuit diagram showing a bit line driver of the nonvolatile memory according to the fifth embodiment.

FIG. 21 is a circuit diagram of a bit line driver BLDRV according to the present embodiment. A partial circuit 520 in FIG. 21 is the same as the bit line driver 720 in FIG. 28.

In addition to including the bit line driver BLDRV shown in FIG. 28, the present bit line driver BLDRV further includes an unselecting bit line voltage switching circuit 520' including two NMOS transistors 524 and 525, which are a third transistor and a fourth transistor respectively, in order to be able to select between the two unselecting bit line voltages VUB and VUB1.

The NMOS transistor 524 is provided between a power wire of the unselecting bit line voltage VUB and an NMOS transistor 521 (corresponding to the NMOS transistor 721 in FIG. 28), and controlled by an unselecting bit line voltage selecting signal VUBSEL based on positive logic. The NMOS transistor 525 is provided between a power wire of the unselecting bit line voltage VUB1 and the NMOS transistor 521, and controlled by an unselecting bit line voltage selecting signal VUXSELn based on opposite logic to the unselecting bit line voltage selecting signal VUBSEL.

According to this configuration, when the column selecting signal CSELn is activated and the unselecting bit line voltage selecting signal VUBSEL is activated, the unselecting bit line voltage VUB is supplied to the bit line BL. On the other hand, when the column selecting signal CSELn is activated and the unselecting bit line voltage selecting signal VUBSELn is activated, the unselecting bit line voltage VUB1 is supplied to the bit line BL.

Figure 22:
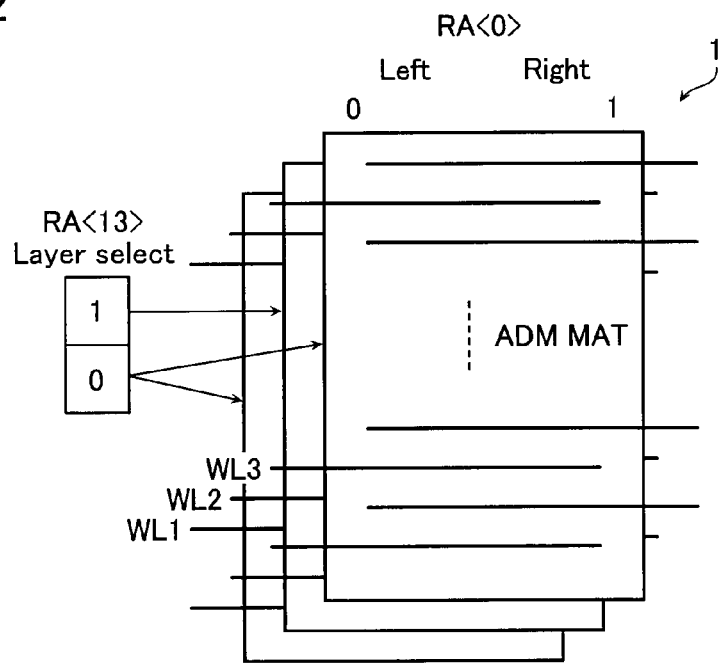
FIG. 22 is a diagram for explaining physical assignment of a row address according to the fifth embodiment.
Figure 23:
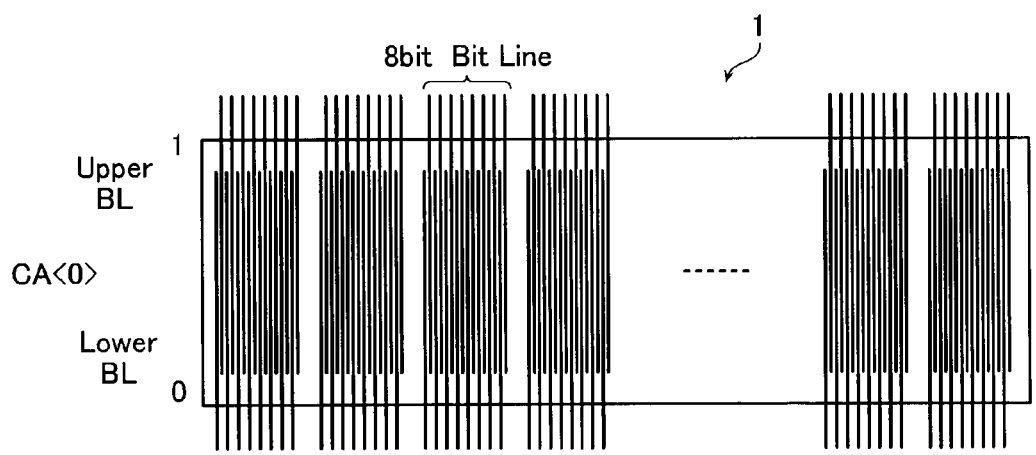
FIG. 23 is a diagram for explaining physical assignment of a column address according to the fifth embodiment.

The unselecting word line voltage selecting signal VUXSEL and the unselecting bit line voltage selecting signal VUBSEL are determined by a row address RA<0> shown in FIG. 22 and a column address CA<0> shown in FIG. 23, respectively. A memory cell array 1 of a nonvolatile memory shown in FIG. 22 and FIG. 23 is composed of a plurality of cell array layers which are stacked. The word lines WL and bit lines BL of each cell array layer are selected by row control circuits 3a and 3b and column control circuits 2a and 2b respectively, like the case shown in FIG. 13.

In the case shown in FIG. 22, the row address RA includes fourteen bits, and the most significant bit RA<13> is used for selecting a cell array layer. Specifically, a cell array layer of an odd ordinal number is selected by RA<13>="0", and a cell array layer of an even ordinal number is selected by RA<13>="1". The least significant bit RA<0> of the row address RA is used for selecting a word line WL of each cell array layer. Specifically, a word line WL driven by the row control circuit disposed at the left-hand side of the memory cell array 1 is selected by RA<0>="0", and a word line WL driven by the row control circuit disposed at the right-hand side of the memory cell array 1 is selected by RA<0>="1". Here, the unselecting word line voltage selecting signal VUXSEL is determined by the least significant bit RA<0> of the row address RA, as described above. Therefore, a word line WL driven by the row control circuit disposed at the left-hand side of the memory cell array 1 is supplied with the first unselecting word line voltage VUX, while a word line WL driven by the row control circuit disposed at the right-hand side of the memory cell array 1 is supplied with the second unselecting word line voltage VUX1.

In the case shown in FIG. 23, the least significant bit CA<0> of the column address CA is used for selecting a bit line BL of each cell array layer. Specifically, a bit line BL driven by the column control circuit disposed at the upper side of the memory cell array 1 is selected by CA<0>="0", and a bit line BL driven by the column control circuit disposed at the lower side of the memory cell array 1 is selected by CA<0>="1". As described above, the unselecting bit line voltage selecting signal VUBSEL is determined by the least significant bit CA<0> of the column address CA. Therefore, a bit line BL driven by the column control circuit disposed at the upper side of the memory cell array 1 is supplied with the second unselecting bit line voltage VUB1, while a bit line BL driven by the column control circuit disposed at the lower side of the memory cell array 1 is supplied with the first unselecting bit line voltage VUB.

Hence, according to the present embodiment in which a row address RA<0> and a column address CA<0> are assigned and these row address RA<0> and column address CA<0> are associated with the unselecting word line voltage selecting signal VUXSEL and the unselecting bit line voltage selecting signal VUBSEL, each memory cell can be supplied with an appropriate bias voltage that would not cause erroneous writing, even when row control circuits or column control circuits are provided dispersedly.

Further, the use of the word line driver 510 shown in FIG. 20 and the bit line driver 520 shown in FIG. 21 eliminates the necessity in the fourth embodiment of serially supplying the unselecting word line voltages VUX and VUX1 or the unselecting bit line voltages VUB and VUB1, and hence makes it possible to access more memory cells MC at a time than accessed in the fourth embodiment.

[Sixth Embodiment]

The fifth embodiment has explained a word line driver WLDRV configured to supply two unselecting word line voltages VUX and VUX1 and a bit line driver BLDRV configured to supply two unselecting bit line voltages VUB and VUB1. The sixth embodiment is an improvement of the fifth embodiment.

Figure 24:
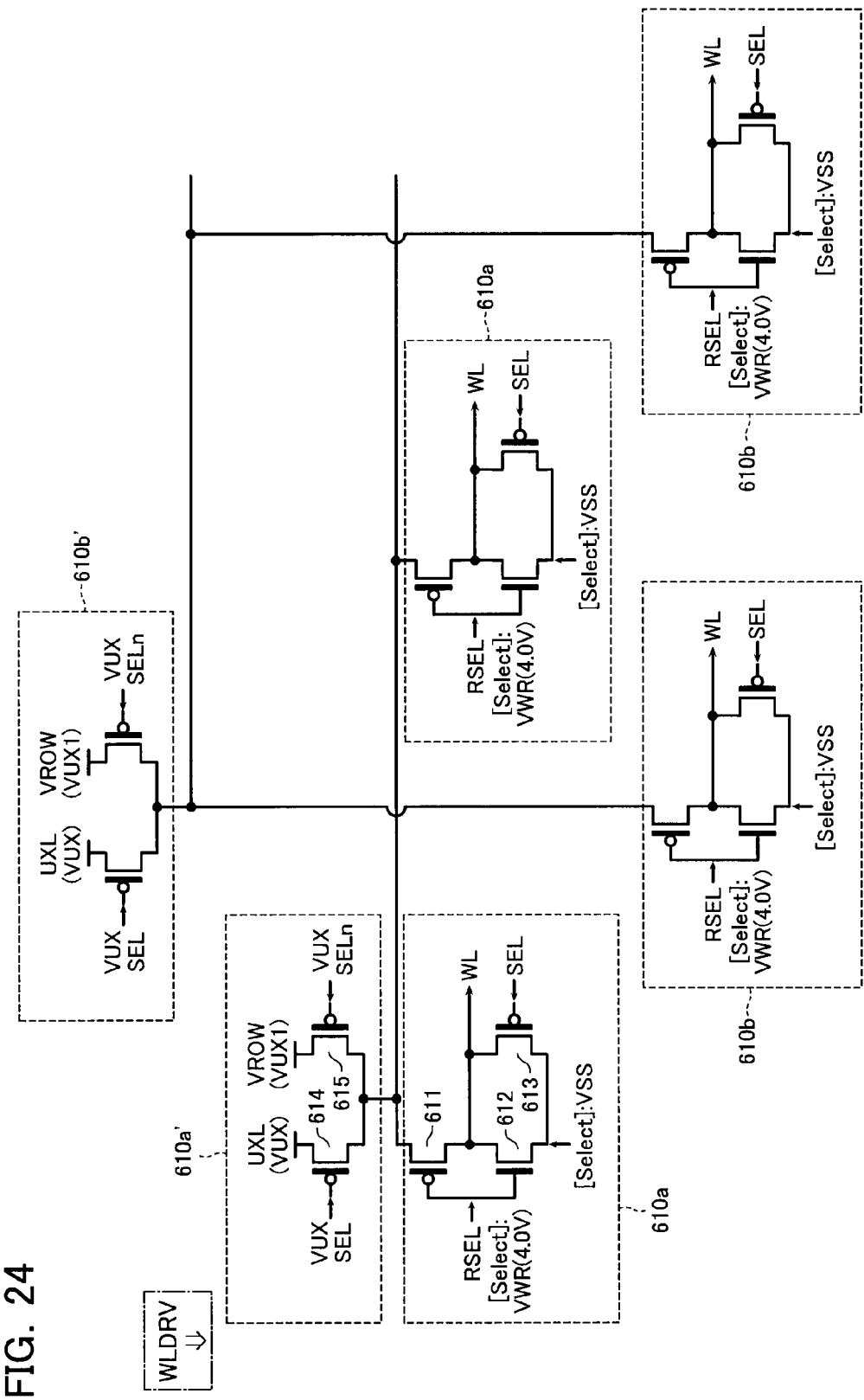
FIG. 24 is a circuit diagram showing a word line driver of a nonvolatile memory according to a sixth embodiment.

FIG. 24 is a circuit diagram showing the vicinity of a word line driver WLDRV and a bit line driver BLDRV of a nonvolatile memory according to the sixth embodiment.

The word line driver WLDRV according to the present embodiment includes partial circuits 610*a* and 610*a'* (or 610*b* and 610*b'*) corresponding to the partial circuits 510 and 510' of the word line driver WLDRV shown in FIG. 20.

However, the partial circuit 610*a'* (or 610*b'*) of the present embodiment is shared among word line drivers WLDRV that supply the same one of the unselecting word line voltages VUX and VUX1 as one another.

In the fifth embodiment, each of the plurality of word line drivers WLDRV is composed of five transistors.

In this regard, the present embodiment can reduce the number of transistors because the partial circuit 610*a'* (or 610*b'*) is shared among a plurality of word line drivers WLDRV. As a result, it is possible not only to obtain the same effect as the embodiments described above but also to save the chip area and the manufacturing costs.

[Others]

While certain embodiments have been described, these embodiments have been presented by way of example only, and are not intended to limit the scope of the inventions. Indeed, the novel methods and systems described herein may be embodied in a variety of other forms: furthermore, various omissions, substitutions, and changes in the form of the methods and systems described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device, comprising:
    a memory cell array including a plurality of first lines and second lines intersecting each other, and a plurality of memory cells connected at intersections of the plurality of first lines and second lines respectively; and
    a first line control circuit and a second line control circuit configured to select the first lines and the second lines respectively to supply a voltage or current necessary for a resetting operation or a setting operation on the memory cells,
    the first line control circuit including a plurality of unselecting voltage generating circuits each configured to generate an unselecting voltage of a different value, and a switching circuit configured to select a certain one of the unselecting voltages from the plurality of unselecting voltages corresponding to a distance between unselected ones of the first lines and the second line control circuit and supply the selected unselecting voltage to the unselected first lines.

2. The nonvolatile semiconductor memory device according to claim 1,
    wherein the plurality of first lines are divided into a first group of first lines closer to the second line control circuit and a second group of first lines farther from the second line control circuit, and
    the first line control circuit supplies a first unselecting voltage to unselected ones of the first lines included in the first group of first lines, and a second unselecting voltage different from the first unselecting voltage to unselected ones of the first lines included in the second group of first lines.

3. The nonvolatile semiconductor memory device according to claim 1,
    wherein the plurality of second lines are divided into a first group of second lines closer to the first line control circuit and a second group of second lines farther from the first line control circuit, and
    the second line control circuit supplies a first unselecting voltage to unselected ones of the second lines included in the first group of second lines, and a second unselecting voltage different from the first unselecting voltage to unselected ones of the second lines included in the second group of second lines.

4. The nonvolatile semiconductor memory device according to claim 2,
    wherein first addresses are assigned in an order from the first group of first lines to the second group of first lines or in an order from the second group of first lines to the first group of first lines.

5. The nonvolatile semiconductor memory device according to claim 4,
    wherein the first unselecting voltage and the second unselecting voltage are serially supplied based on the first addresses.

6. The nonvolatile semiconductor memory device according to claim 4,
    wherein the switching circuit of the first line control circuit includes a first transistor configured to supply the first unselecting voltage and a second transistor configured to supply the second unselecting voltage, and the first transistor and the second transistor are individually controlled in accordance with the first addresses.

7. The nonvolatile semiconductor memory device according to claim 3,
    wherein second addresses are assigned in an order from the first group of second lines to the second group of second lines or in an order from the second group of second lines to the first group of second lines.

8. The nonvolatile semiconductor memory device according to claim 7,
    wherein the first unselecting voltage and the second unselecting voltage are serially supplied based on the second addresses.

9. The nonvolatile semiconductor memory device according to claim 7,
    wherein the second line control circuit includes a third transistor configured to supply the first unselecting voltage and a fourth transistor configured to supply the second unselecting voltage, and the third transistor and the fourth transistor are individually controlled in accordance with the second addresses.

10. A nonvolatile semiconductor memory device, comprising:
- a memory cell array including a plurality of first lines and second lines intersecting each other, and a plurality of memory cells connected at intersections of the plurality of first lines and second lines respectively; and
- a first line control circuit and a second line control circuit configured to select the first lines and the second lines respectively to supply a voltage or current necessary for a resetting operation or a setting operation on the memory cells,
- the first line control circuit including a plurality of unselecting voltage generating circuits each configured to generate an unselecting voltage for the first lines of a different value, and a switching circuit configured to select a certain one of the unselecting voltages for the first lines from the plurality of unselecting voltages for the first lines corresponding to a distance between unselected ones of the first lines and the second line control circuit and supply the selected unselecting voltage for the first lines to the unselected first lines, and
- the second line control circuit including a plurality of unselecting voltage generating circuits each configured to generate an unselecting voltage for the second lines of a different value, and a switching circuit configured to select a certain one of the unselecting voltages for the second lines from the plurality of unselecting voltages for the second lines corresponding to a distance between unselected one of the second lines and the first line control circuit and supply the selected unselecting voltage for the second lines to the unselected second lines.

11. The nonvolatile semiconductor memory device according to claim 10,
- wherein the plurality of first lines are divided into a first group of first lines closer to the second line control circuit and a second group of first lines farther from the second line control circuit, and
- the first line control circuit supplies a first unselecting voltage to unselected ones of the first lines included in the first group of first lines and a second unselecting voltage different from the first unselecting voltage to unselected ones of the first lines included in the second group of first lines.

12. The nonvolatile semiconductor memory device according to claim 10,
- wherein the plurality of second lines are divided into a first group of second lines closer to the first line control circuit and a second group of second lines farther from the first line control circuit, and
- the second line control circuit supplies a first unselecting voltage to unselected ones of the second lines included in the first group of second lines and a second unselecting voltage different from the first unselecting voltage to unselected ones of the second lines included in the second group of second lines.

13. The nonvolatile semiconductor memory device according to claim 11,
- wherein first addresses are assigned in an order from the first group of first lines to the second group of first lines or in an order from the second group of first lines to the first group of first lines.

14. The nonvolatile semiconductor memory device according to claim 11,
- wherein the first unselecting voltage and the second unselecting voltage are serially supplied based on the first addresses.

15. The nonvolatile semiconductor memory device according to claim 13,
- wherein the switching circuit of the first line control circuit includes a first transistor configured to supply the first unselecting voltage and a second transistor configured to supply the second unselecting voltage, and the first transistor and the second transistor are individually controlled in accordance with the first addresses.

16. The nonvolatile semiconductor memory device according to claim 12,
- wherein second addresses are assigned in an order from the first group of second lines to the second group of second lines or in an order from the second group of second lines to the first group of second lines.

17. The nonvolatile semiconductor memory device according to claim 16,
- wherein the first unselecting voltage and the second unselecting voltage are serially supplied based on the second addresses.

18. The nonvolatile semiconductor memory device according to claim 16,
- wherein the switching circuit of the second line control circuit includes a third transistor configured to supply the second unselecting voltage and a fourth transistor configured to supply the second unselecting voltage, and the third transistor and the fourth transistor are individually controlled in accordance with the second addresses.

19. A nonvolatile semiconductor memory device, comprising:
- a memory cell array including a plurality of first lines and second lines intersecting each other and a plurality of memory cells provided at intersections of the plurality of first lines and second lines respectively, each of the memory cells being composed of a series connection of a variable resistance element having an electrically variable resistance value and a diode having a forward direction in a direction heading from the second lines to the first lines;
- a first line control circuit configured to select a certain first line from the plurality of first lines and supply the selected first line with a selecting voltage; and
- a second line control circuit configured to select a certain second line from the plurality of second lines and supply the selected second line with an erasing voltage higher than the selecting voltage by a voltage necessary for a resetting operation on the memory cell connected at the intersection of the selected first line and the selected second line,
- the plurality of first lines being divided into a first group of first lines closer to the second line control circuit and a second group of first lines farther from the second line control circuit,
- the first line control circuit including a first unselecting voltage generating circuit configured to generate a first unselecting voltage and a second unselecting voltage generating circuit configured to generate a second unselecting voltage and the first line control circuit being configured to supply the first unselecting voltage to unselected ones of the first lines included in the first group of first lines and the second unselecting voltage lower than the first unselecting voltage to unselected ones of the first lines included in the second group of first lines, and
- the first unselecting voltage and the second unselecting voltage being such lower voltages than the erasing voltage that do not reset the memory cells connected at the intersections of the unselected first lines and the selected second line.

20. The nonvolatile semiconductor memory device according to claim 19,
wherein the plurality of second lines are divided into a first group of second lines closer to the first line control circuit and a second group of second lines farther from the first line control circuit,
the second line control circuit supplies a third unselecting voltage to unselected ones of the second lines included in the first group of second lines and a fourth unselecting voltage higher than the third unselecting voltage to unselected ones of the second lines included in the second group of second lines, and
the third unselecting voltage and the fourth unselecting voltage are such higher voltages than the selecting voltage that do not reset the memory cells connected at the intersections of the selected first line and the unselected second lines.

21. The nonvolatile semiconductor memory device according to claim 1,
wherein the first line control circuit includes a first control circuit and a second control circuit, the first control circuit being disposed at a side of one ends of the plurality of first lines and configured to supply a voltage or current necessary for the resetting operation or the setting operation on the memory cells to certain ones of the plurality of first lines, and the second control circuit being disposed at a side of the other ends of the plurality of first lines and configured to supply a voltage or current necessary for the resetting operation or the setting operation on the memory cells to others of the plurality of first lines adjacent to the certain ones of the plurality of first lines.

22. The nonvolatile semiconductor memory device according to claim 1,
wherein the second line control circuit includes a first control circuit and a second control circuit, the first control circuit being disposed at a side of one ends of the plurality of second lines and configured to supply a voltage or current necessary for the resetting operation or the setting operation on the memory cells to certain ones of the plurality of second lines, and the second control circuit being disposed at a side of the other ends of the plurality of second lines and configured to supply a voltage or current necessary for the resetting operation or the setting operation on the memory cells to others of the plurality of second lines adjacent to the certain ones of the plurality of second lines.

23. The nonvolatile semiconductor memory device according to claim 2,
wherein the second line control circuit includes a first control circuit and a second control circuit, the first control circuit being disposed at a side of one ends of the plurality of second lines and configured to supply a voltage or current necessary for the resetting operation or the setting operation on the memory cells to those of the plurality of second lines disposed at even-numbered positions, and the second control circuit being disposed at a side of the other ends of the plurality of second lines and configured to supply a voltage or current necessary for the resetting operation or the setting operation on the memory cells to those of the plurality of second lines disposed at odd-numbered positions,
in those of the plurality of first lines disposed at even-numbered positions, first lines closer to the first second control circuit are included in the first group of first lines and first lines farther from the first second control circuit are included in the second group of first lines, and
in those of the plurality of first lines disposed at odd-numbered positions, first lines closer to the second control circuit are included in the first group of first lines and first lines farther from the second control circuit are included in the second group of first lines.

24. The nonvolatile semiconductor memory device according to claim 3,
wherein the first line control circuit includes a first control circuit and a second control circuit, the first control circuit being disposed at a side of one ends of the plurality of first lines and configured to supply a voltage or current necessary for the resetting operation or the setting operation on the memory cells to those of the plurality of first lines disposed at even-numbered positions, and the second control circuit being disposed at a side of the other ends of the plurality of first lines and configured to supply a voltage or current necessary for the resetting operation or the setting operation on the memory cells to those of the plurality of first lines disposed at odd-numbered positions,
in those of the plurality of second lines disposed at even-numbered positions, second lines closer to the first control circuit are included in the first group of second lines and second lines farther from the first control circuit are included in the second group of second lines, and
in those of the plurality of second lines disposed at odd-numbered positions, second lines closer to the second first control circuit are included in the first group of second lines and second lines farther from the second first control circuit are included in the second group of second lines.

\* \* \* \* \*